(12) United States Patent
Lee et al.

(10) Patent No.: US 8,883,576 B2
(45) Date of Patent: Nov. 11, 2014

(54) METHODS OF FABRICATING SEMICONDUCTOR DEVICES USING MASK SHRINKING

(75) Inventors: Jinkwan Lee, Seoul (KR); Yoochul Kong, Seoul (KR); Seongsoo Lee, Seongnam-si (KR)

(73) Assignee: Samsung Electronics Co., Ltd. (KR)

( * ) Notice: Subject to any disclaimer, the term of this patent is extended or adjusted under 35 U.S.C. 154(b) by 113 days.

(21) Appl. No.: 13/614,265

(22) Filed: Sep. 13, 2012

(65) Prior Publication Data
US 2013/0109158 A1 May 2, 2013

(30) Foreign Application Priority Data
Oct. 31, 2011 (KR) .................. 10-2011-0112407

(51) Int. Cl.
| | |
|---|---|
| H01L 21/00 | (2006.01) |
| H01L 21/338 | (2006.01) |
| H01L 29/74 | (2006.01) |
| H01L 29/80 | (2006.01) |
| H01L 27/115 | (2006.01) |
| H01L 21/3213 | (2006.01) |
| H01L 21/033 | (2006.01) |
| H01L 21/311 | (2006.01) |
| H01L 29/66 | (2006.01) |

(52) U.S. Cl.
CPC .... H01L 21/31144 (2013.01); H01L 27/11582 (2013.01); H01L 21/32137 (2013.01); H01L 21/0337 (2013.01); H01L 29/66545 (2013.01)

USPC ............ 438/156; 438/173; 438/192; 438/212; 257/135; 257/263; 257/302

(58) Field of Classification Search
USPC ......... 438/137, 138, 156, 173, 192, 212, 268; 257/135, 263, 302, 328
See application file for complete search history.

(56) References Cited

U.S. PATENT DOCUMENTS 8,592,837 B2 * 11/2013 Hodota et al. .................. 257/88
2010/0181612 A1 7/2010 Kito et al.

FOREIGN PATENT DOCUMENTS

| JP | 2010-171185 | 8/2010 |
|---|---|---|
| JP | 2010-186868 | 8/2010 |
| KR | 1020100053393 A | 5/2010 |
| KR | 1020110001595 A | 1/2011 |

* cited by examiner

Primary Examiner — Hsien Ming Lee
(74) Attorney, Agent, or Firm — Myers Bigel Sibley & Sajovec, P.A.

(57) ABSTRACT

Provided are methods of fabricating a semiconductor device. The method may include forming a mold layer on a substrate, forming a mask layer on the mold layer, etching the mold layer using the mask layer as an etch mask to form a channel hole penetrating the mold layer, shrinking the mask layer to provide a reduced mask layer, forming a spacer layer to cover the reduced mask layer, and forming a vertical channel to fill the channel hole and be electrically connected to the substrate. As a result, the channel hole can have an enlarged entrance.

15 Claims, 23 Drawing Sheets

METHODS OF FABRICATING SEMICONDUCTOR DEVICES USING MASK SHRINKING

CROSS-REFERENCE TO RELATED APPLICATIONS

This U.S. non-provisional patent application claims priority under 35 U.S.C. §119 to Korean Patent Application No. 10-2011-0112407, filed on Oct. 31, 2011, in the Korean Intellectual Property Office, the entire contents of which are hereby incorporated by reference.

BACKGROUND

Embodiments of the inventive concept relate to semiconductor devices, more particularly, to methods for fabricating a semiconductor device.

Deposition and etching processes are used to fabricate a semiconductor device. However, there may be technical difficulties in supplying a deposition or etching gas into the deep holes, especially holes with a narrow opening. This difficulty may be overcome by enlarging an overall size of the hole, but this approach may reduce the integration level of the device.

SUMMARY

According to example embodiments of the inventive concepts, a method of fabricating a semiconductor device may include enlarging an entrance of hole, which a deposition and/or etching gas is supplied through.

According to example embodiments of the inventive concepts, a method of fabricating a semiconductor device may include forming a mold layer on a substrate, forming a mask layer on the mold layer, etching the mold layer using the mask layer as an etch mask to form a channel hole penetrating the mold layer, shrinking the mask layer, forming a spacer layer to cover the reduced mask layer, and forming a vertical channel to fill the channel hole and be electrically connected to the substrate.

In some embodiments, the forming of the mask layer may include sequentially forming a lower mask layer including a silicon layer, an intermediate mask layer including an oxide or nitride layer, and an upper mask layer including a carbon layer, on the mold layer, and patterning the upper, intermediate, and lower mask layers to expose a portion of the mold layer.

In some embodiments, the shrinking of the mask layer may include removing the upper mask layer, and etching a side surface of the lower mask layer. The intermediate mask layer may be formed to cover a top surface of the lower mask layer, thereby preventing the top surface of the lower mask layer from being etched.

In some embodiments, the method may further include removing the intermediate mask layer, after the etching of the side surface of the lower mask layer.

In some embodiments, the forming of the mask layer may include sequentially forming a lower mask layer including a silicon layer and an upper mask layer including a carbon layer, on the mold layer, and then patterning the upper and lower mask layers to expose a portion of the mold layer.

In some embodiments, the shrinking of the mask layer may include removing the upper mask layer, and then etching side and top surfaces of the lower mask layer.

In some embodiments, the forming of the vertical channel may include filling a portion of the channel hole to form a lower channel connected to the substrate and filling other portion of the channel hole to form an upper channel connected to the lower conductive layer.

In some embodiments, the lower channel may be formed by growing a single crystalline silicon layer from the substrate exposed by the channel hole, and the upper channel may be formed by depositing a single crystalline silicon layer or a polysilicon layer.

In some embodiments, the method may further include forming a memory layer on an inner wall of the channel hole, before the forming of the upper channel. The memory layer may extend vertically along the inner wall of the channel.

According to other example embodiments of the inventive concepts, a method of fabricating a semiconductor device may include forming a mold stack including insulating layers and sacrificial layers alternatingly stacked on a substrate, forming a mask layer on the mold stack, etching the mold stack using the mask layer as an etch mask to form a channel hole exposing the substrate through the mold layer, shrinking the mask layer to provide a reduced mask layer, forming a spacer layer to wrap the reduced mask layer, and forming a vertical channel including a lower channel and an upper channel, and replacing the sacrificial layers with gates. The lower channel being grown from a substrate exposed by the channel hole and being electrically connected to the substrate, and the upper channel being stacked on the lower channel and being electrically connected to the lower channel.

In some embodiments, the mask layer may include a silicon layer and an oxide layer sequentially stacked on the mold stack, and the shrinking of the mask layer may include selectively etching a side surface of the silicon layer with plasma including at least one of Cl2 and SF6. The oxide layer may be formed to prevent the plasma from being supplied onto a top surface of the silicon layer, thereby preventing the top surface of the silicon layer from being etched.

In some embodiments, the mask layer may include a silicon layer stacked on the mold stack, and the shrinking of the mask layer may include selectively etching side and top surfaces of the silicon layer with plasma including at least one of Cl2 and SF6.

In some embodiments, the upper spacer layer extends into the channel hole to cover an upper side surface of the mold stack.

In some embodiments, the replacing of the sacrificial layers with the gates may include forming a trench between the vertical channels to expose the substrate through the mold stack, supplying an etchant through the trench to selectively remove the sacrificial layers, and forming the gates extending along a first horizontal direction on the substrate. The gates may be formed by filling empty spaces, which may be provided between the insulating layers by the removing of the sacrificial layers, with a conductive material.

In some embodiments, the method may further include forming at least one of bit line electrically connected to the vertical channel, the bit line extending along a second horizontal direction crossing the first horizontal direction.

BRIEF DESCRIPTION OF THE DRAWINGS

Example embodiments will be more clearly understood from the following brief description taken in conjunction with the accompanying drawings. The accompanying drawings represent non-limiting, example embodiments as described herein.

DESCRIPTION OF EMBODIMENTS ACCORDING TO THE INVENTIVE CONCEPT

Figure 1A:
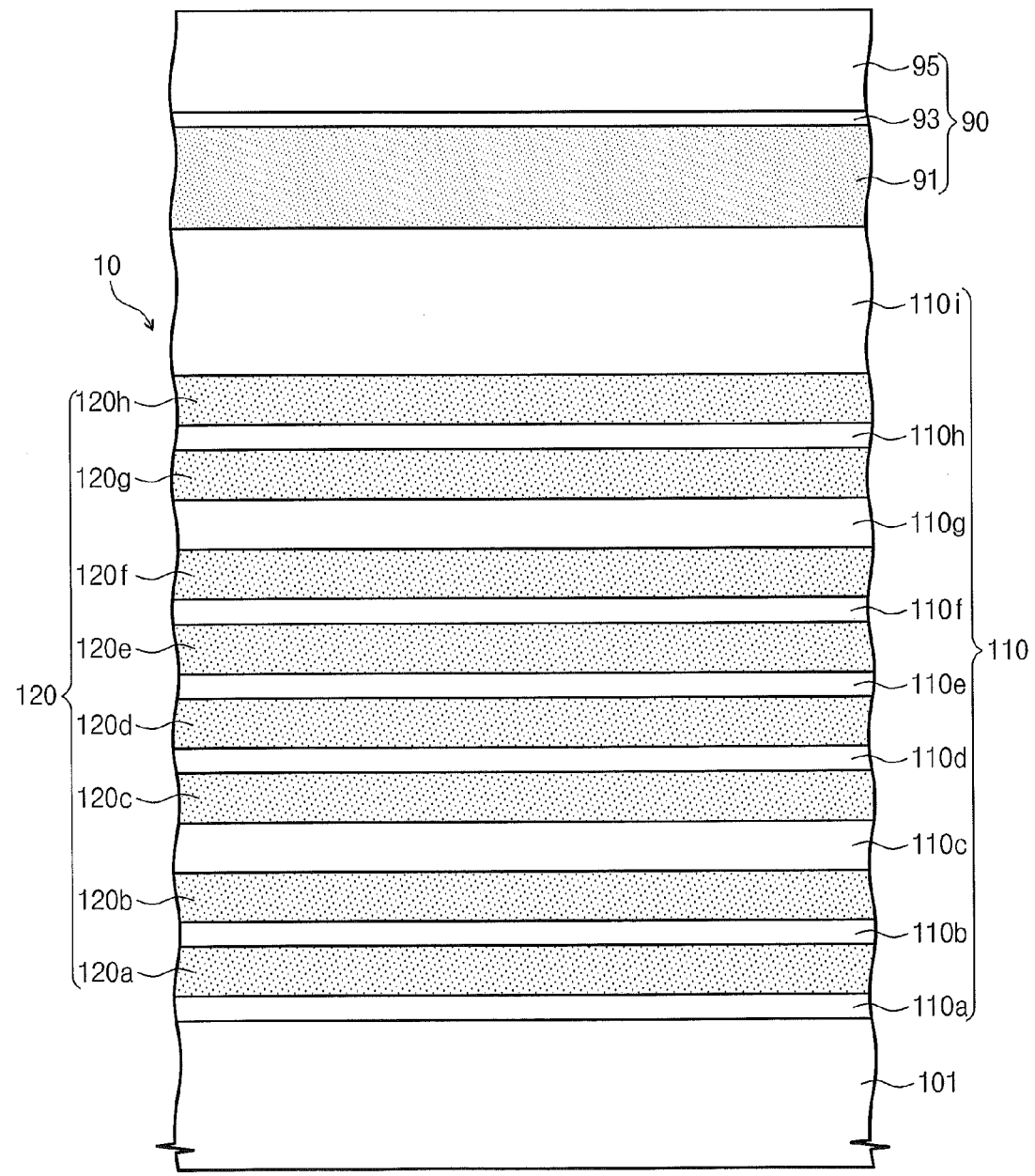
FIGS. 1A through 1P are sectional views illustrating methods of fabricating a semiconductor device according to example embodiments of the inventive concept.

Example embodiments of the inventive concept will now be described more fully with reference to the accompanying drawings, in which example embodiments are shown. Example embodiments of the inventive concept may, however, be embodied in many different forms and should not be construed as being limited to the embodiments set forth herein; rather, these embodiments are provided so that this disclosure will be thorough and complete, and will fully convey the concept of example embodiments to those of ordinary skill in the art. In the drawings, the thicknesses of layers and regions are exaggerated for clarity. Like reference numerals in the drawings denote like elements, and thus their description will be omitted.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. As used herein the term "and/or" includes any and all combinations of one or more of the associated listed items. Other words used to describe the relationship between elements or layers should be interpreted in a like fashion (e.g., "between" versus "directly between," "adjacent" versus "directly adjacent," "on" versus "directly on").

It will be understood that, although the terms "first", "second", etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of example embodiments.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises", "comprising", "includes" and/or "including," if used herein, specify the presence of stated features, integers, steps, operations, elements and/or components, but do not preclude the presence or addition of one or more other features, integers, steps, operations, elements, components and/or groups thereof.

Example embodiments of the inventive concept are described herein with reference to cross-sectional illustrations that are schematic illustrations of idealized embodiments (and intermediate structures) of example embodiments. As such, variations from the shapes of the illustrations as a result, for example, of manufacturing techniques and/or tolerances, are to be expected. Thus, example embodiments of the inventive concept should not be construed as limited to the particular shapes of regions illustrated herein but are to include deviations in shapes that result, for example, from manufacturing. For example, an implanted region illustrated as a rectangle may have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of example embodiments.

Unless otherwise defined, all terms (including technical and scientific terms) used herein have the same meaning as commonly understood by one of ordinary skill in the art to which example embodiments of the inventive concept belong. It will be further understood that terms, such as those defined in commonly-used dictionaries, should be interpreted as having a meaning that is consistent with their meaning in the context of the relevant art and will not be interpreted in an idealized or overly formal sense unless expressly so defined herein.

First Embodiment

Figure 1B:
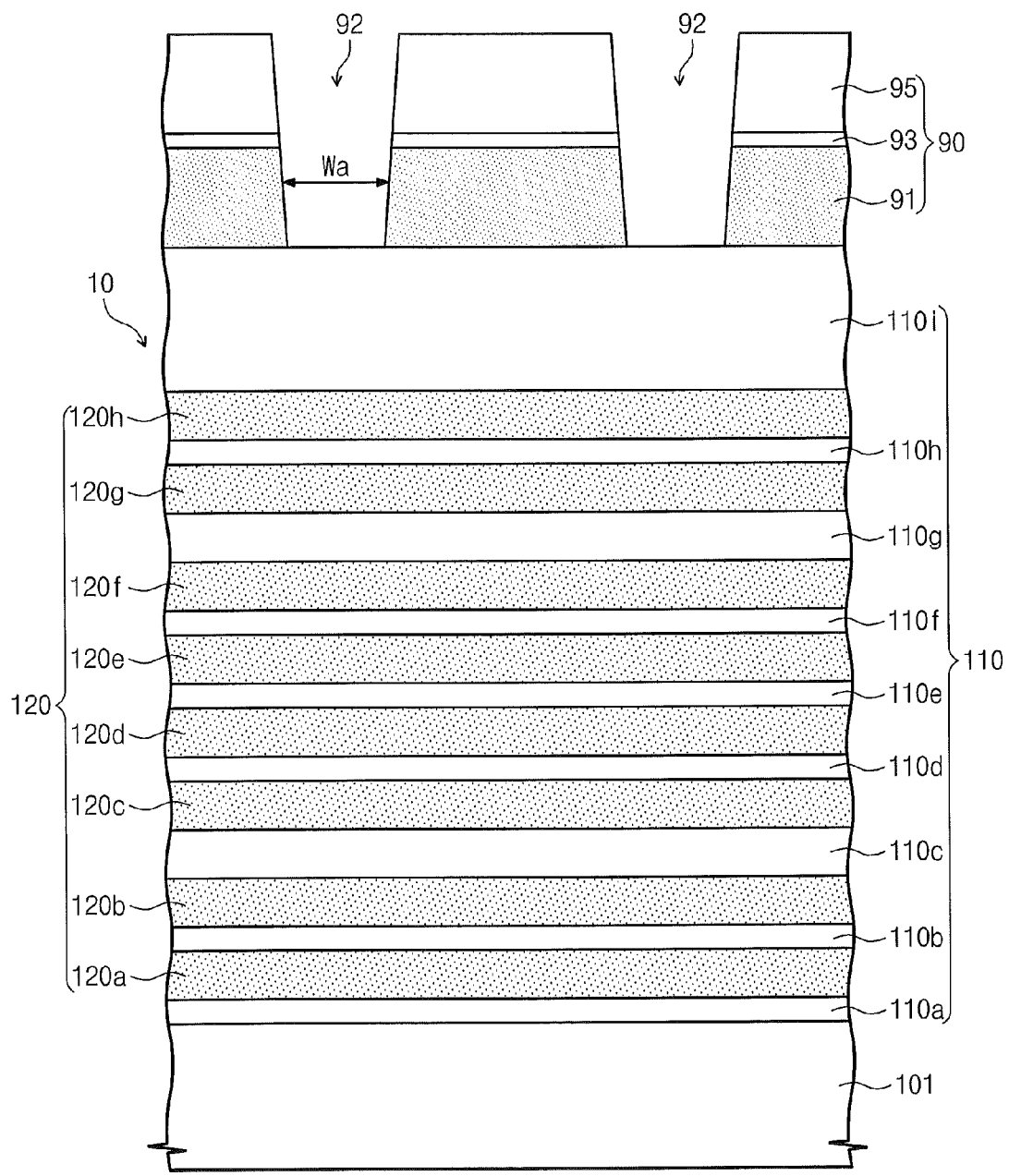
Figure 1C:
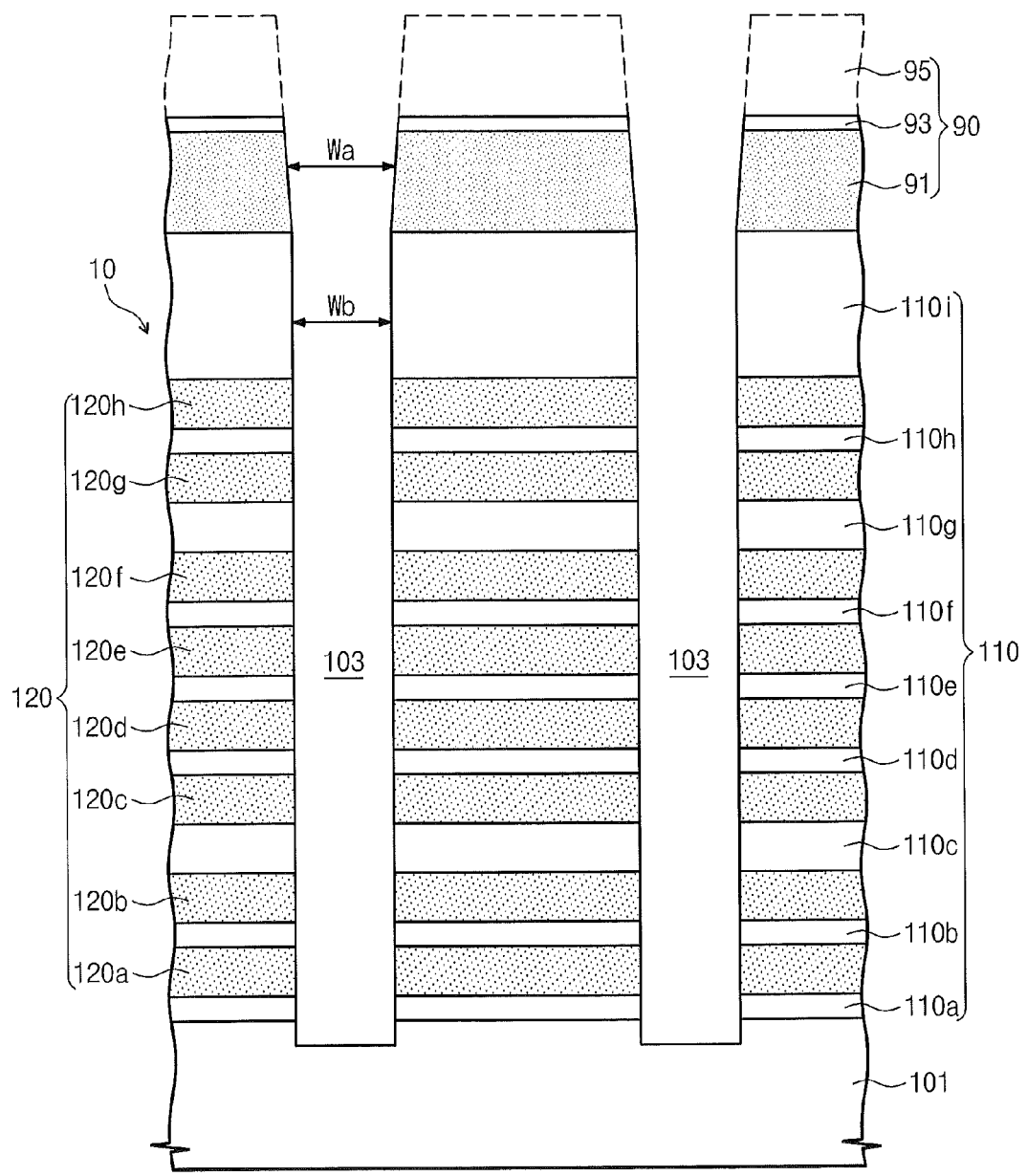
Figure 1D:
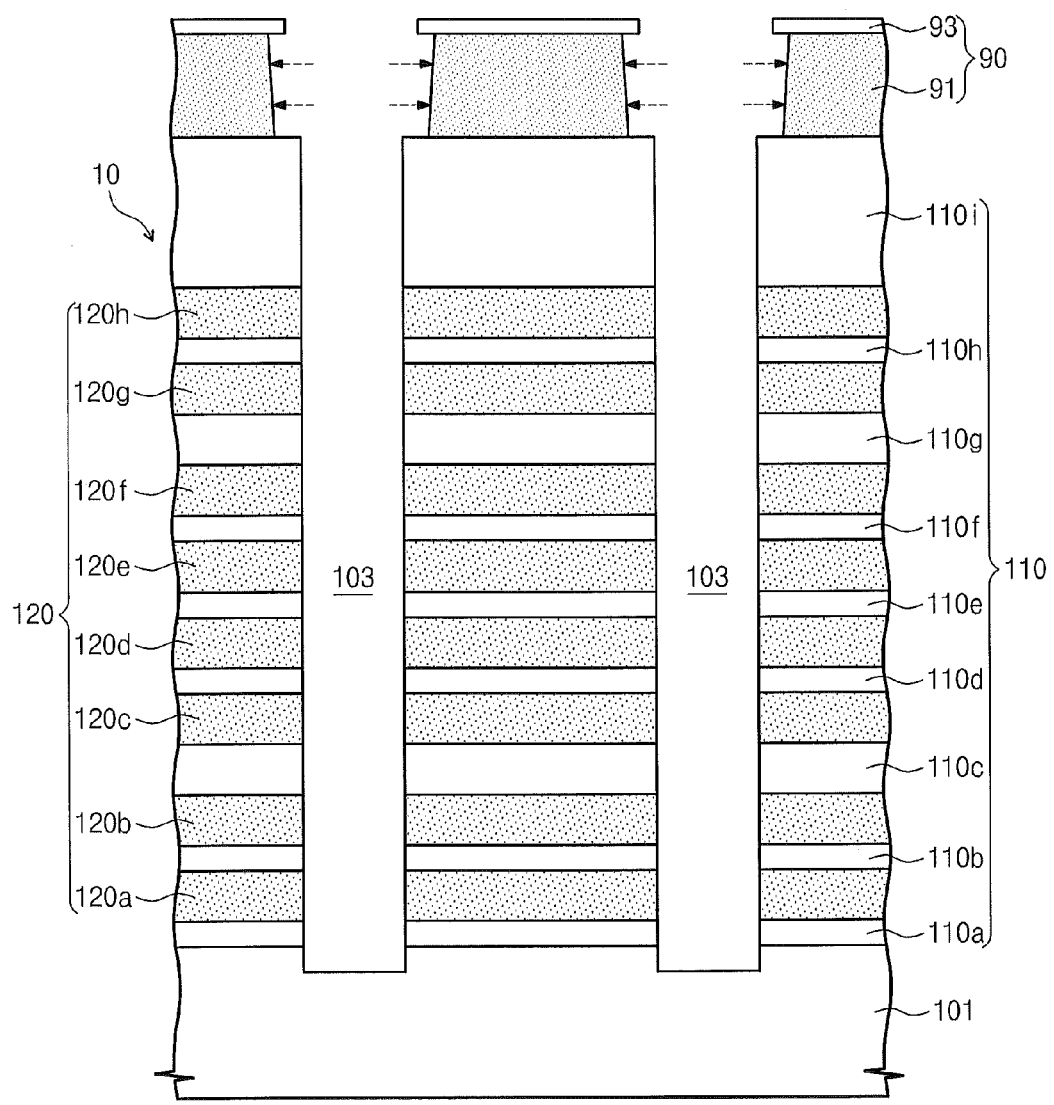
Figure 1E:
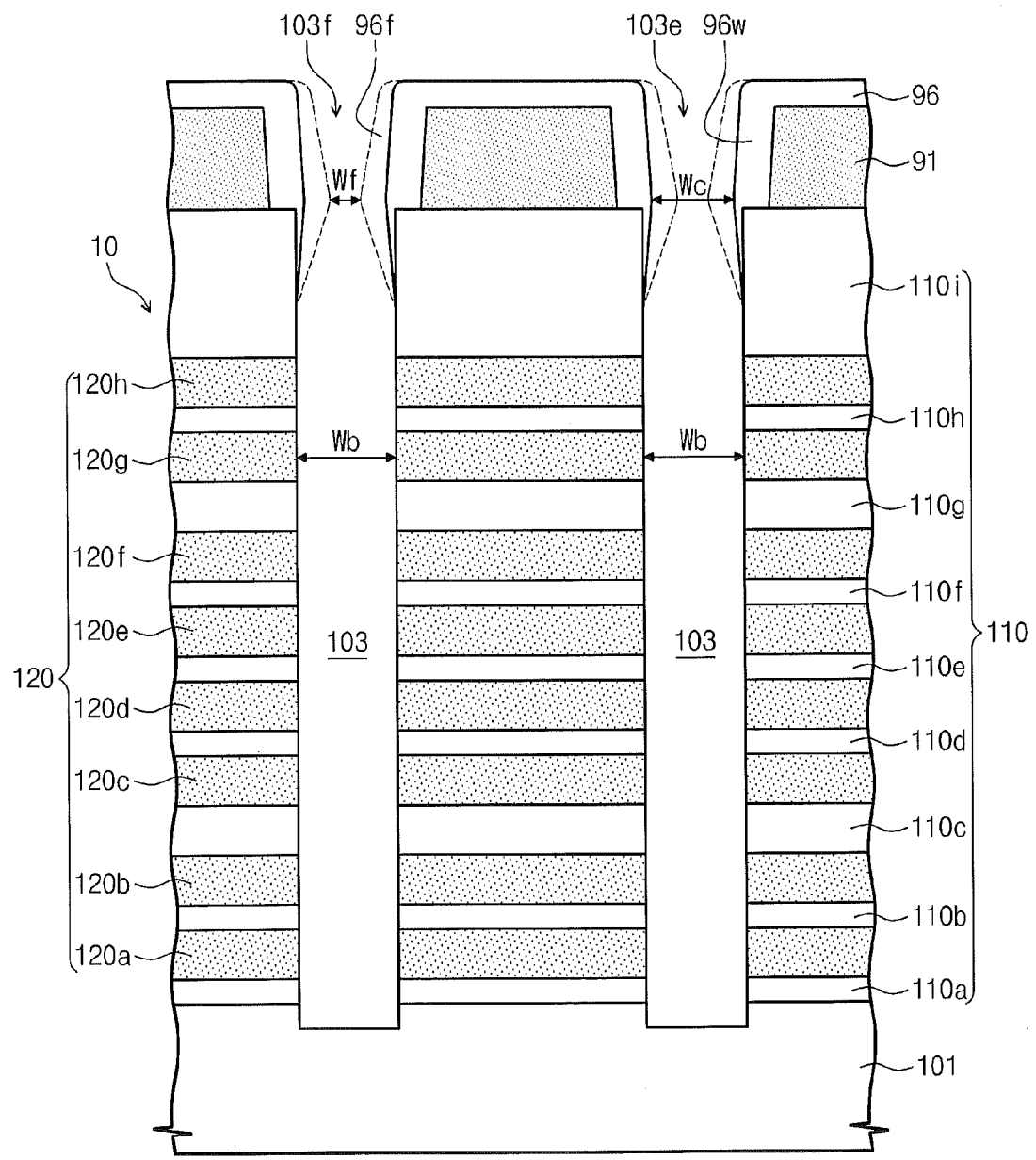
Figure 1F:
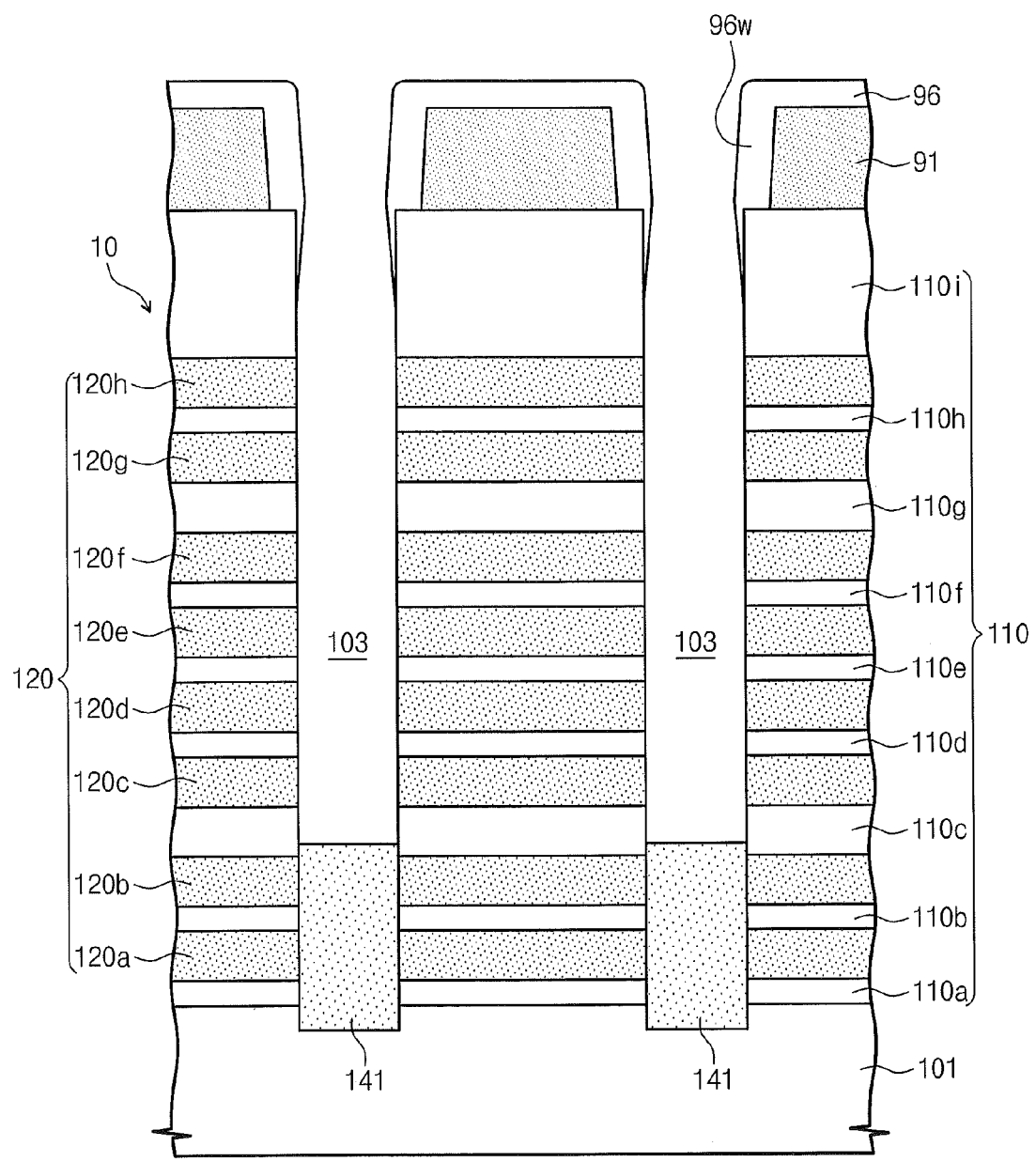
Figure 1G:
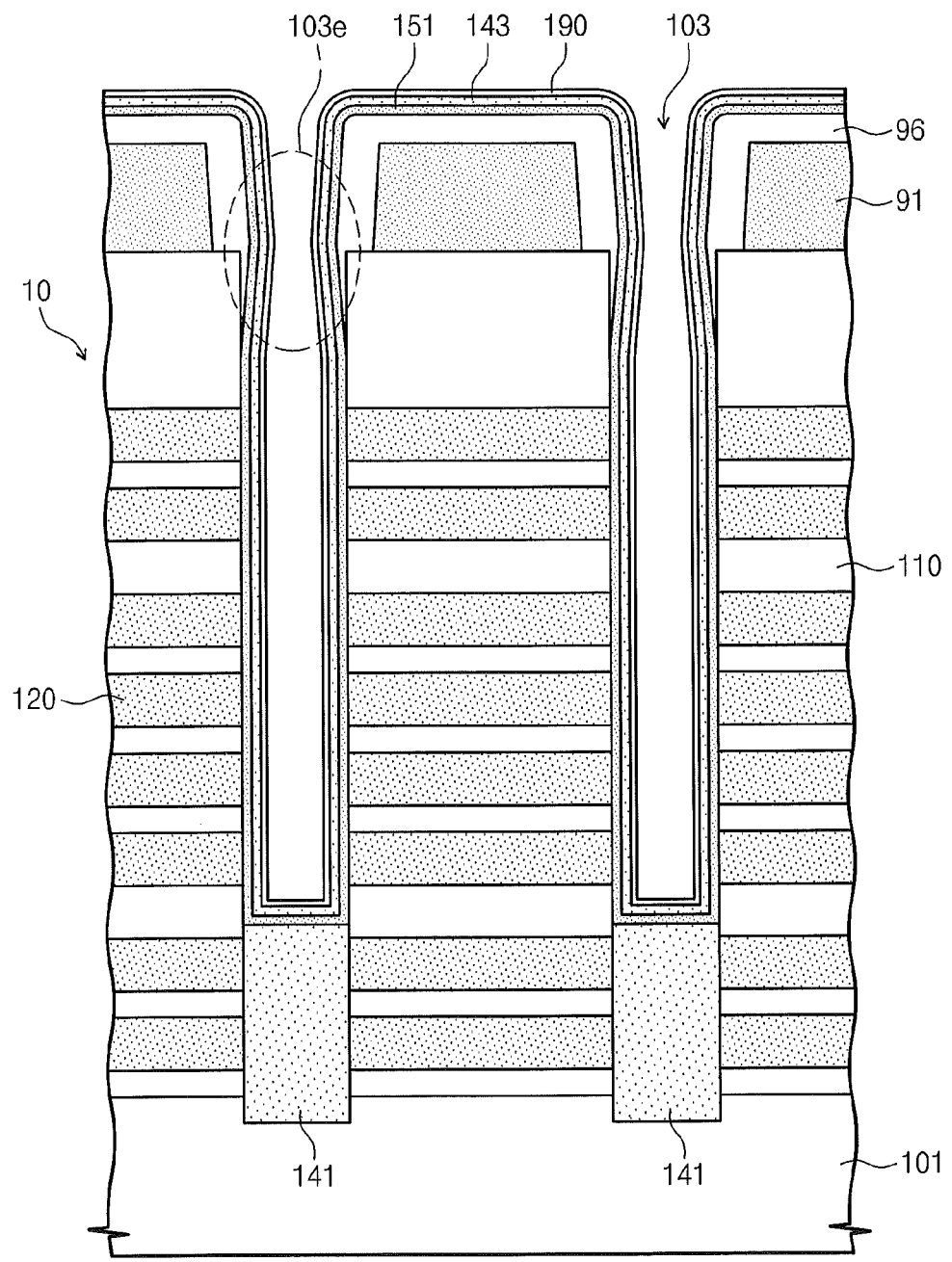
Figure 1H:
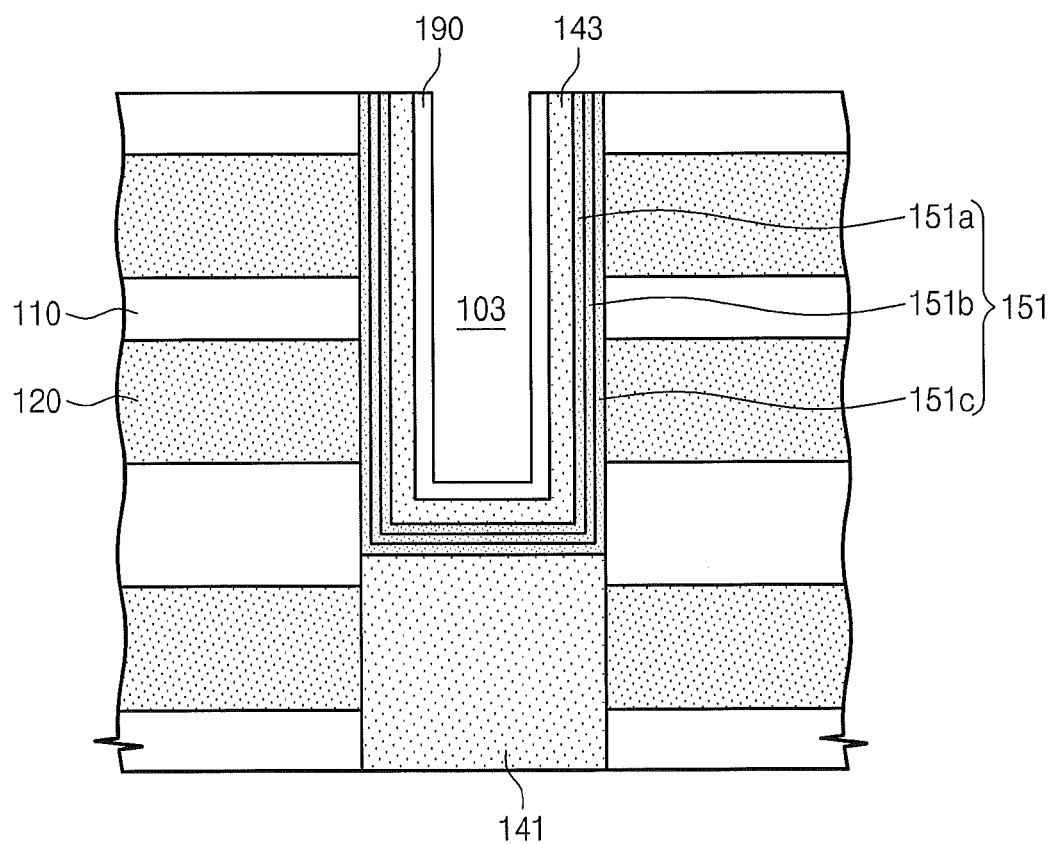
Figure 1I:
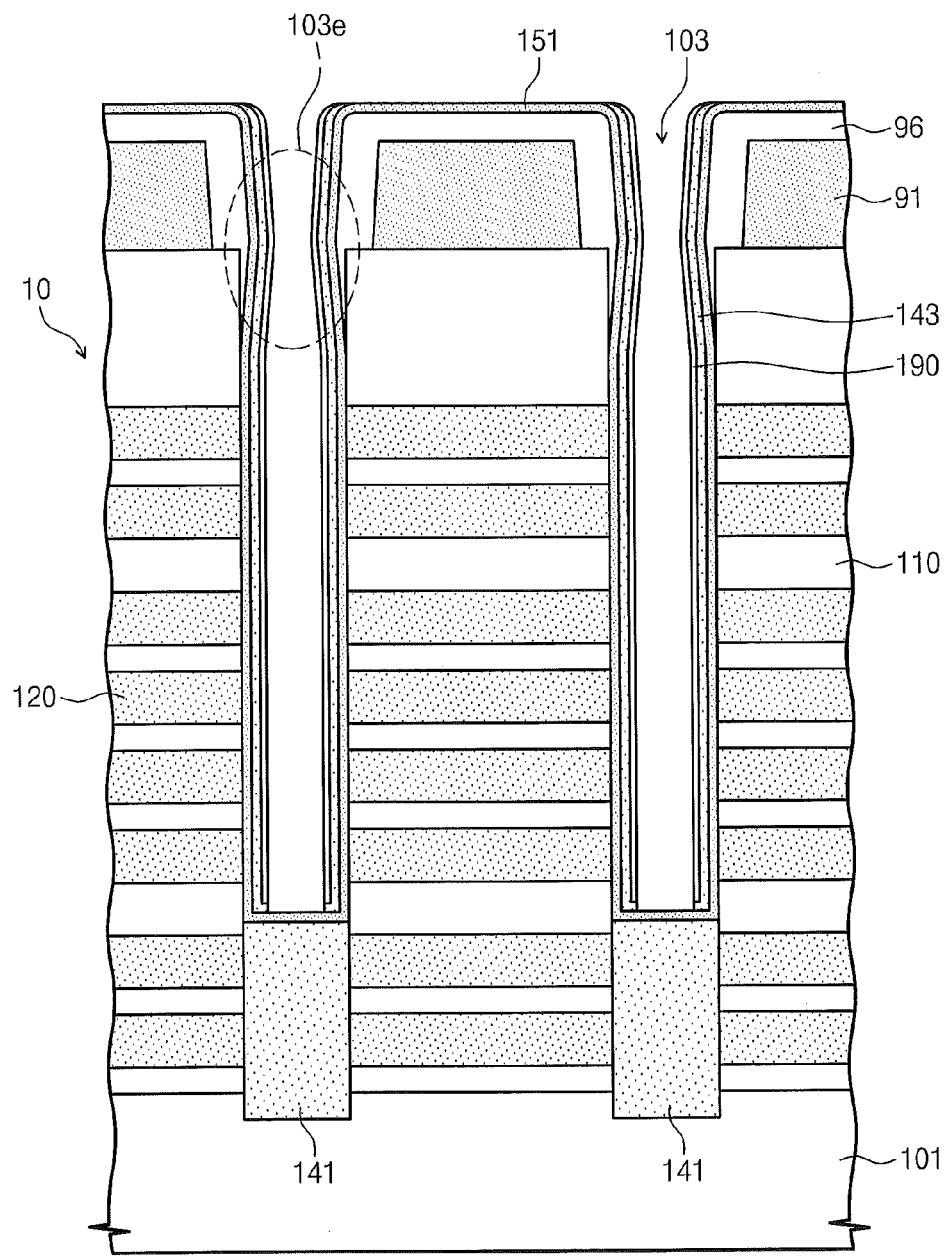
Figure 1J:
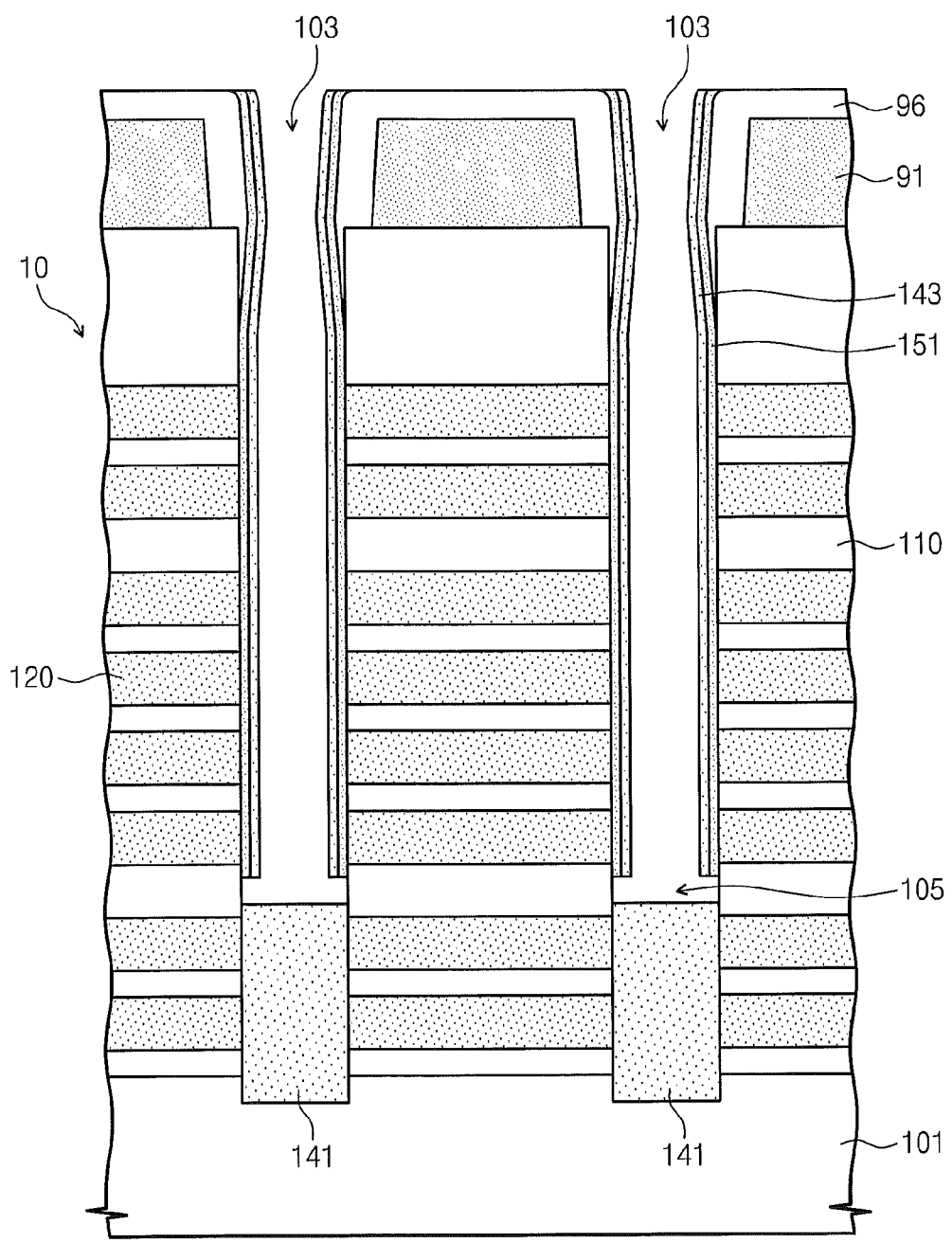
Figure 1K:
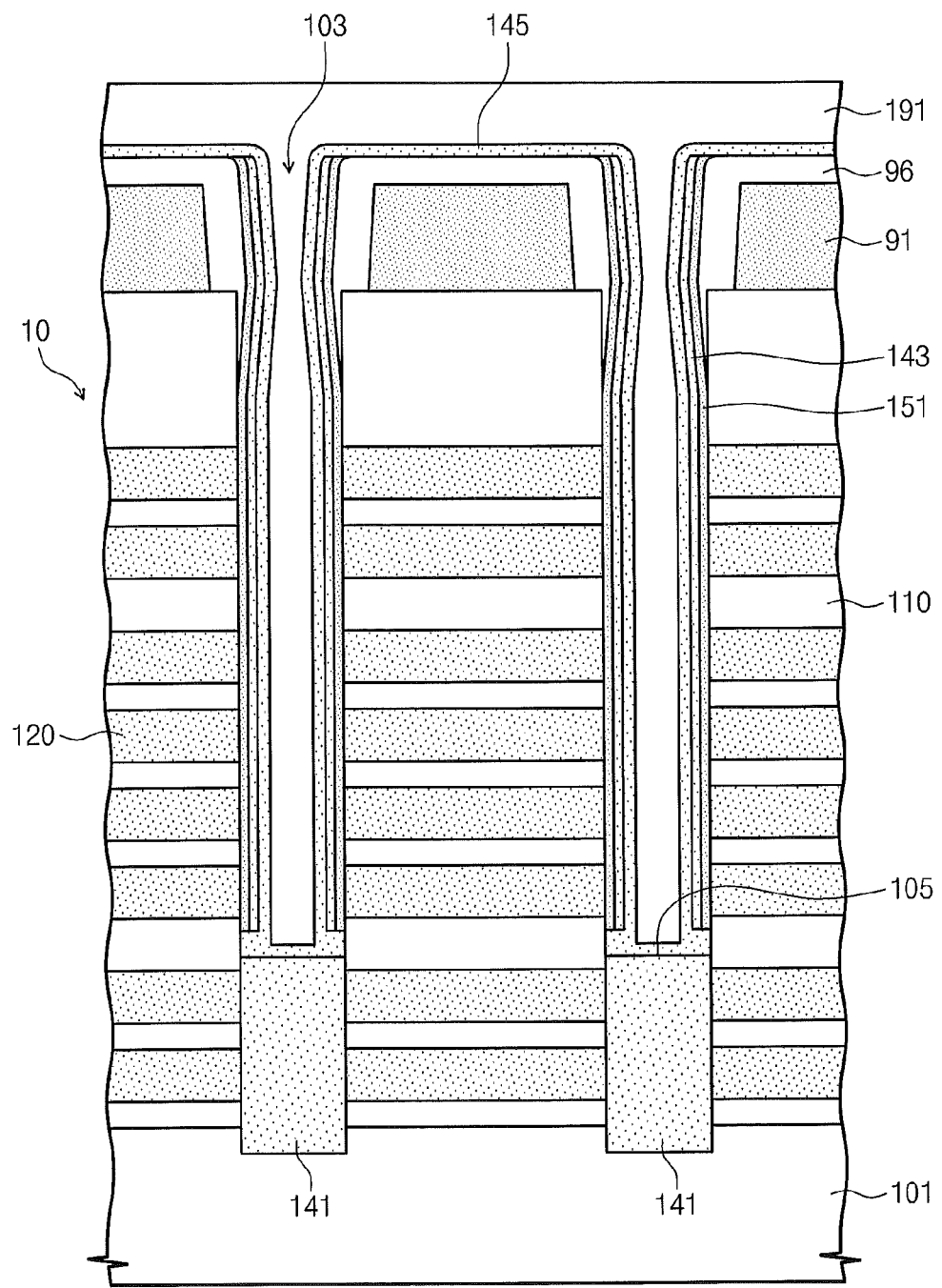
Figure 1L:
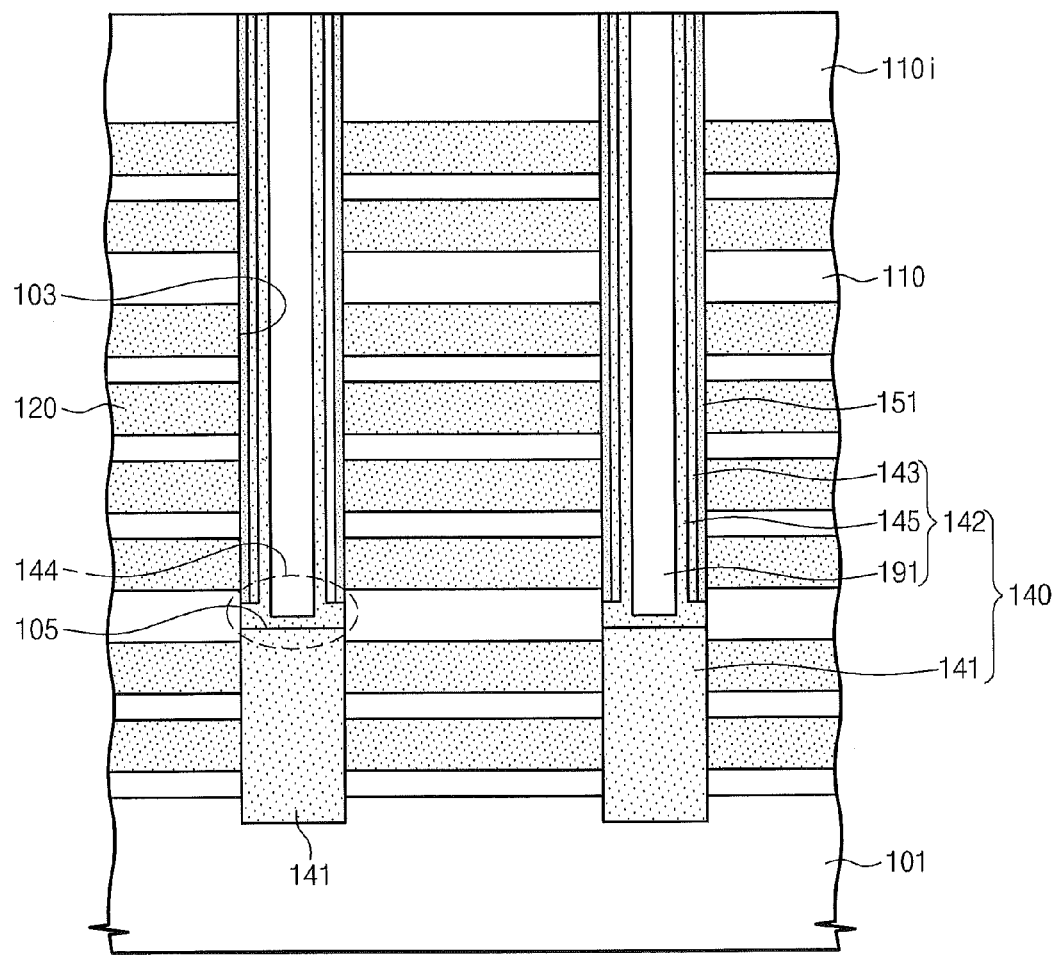
Figure 1M:
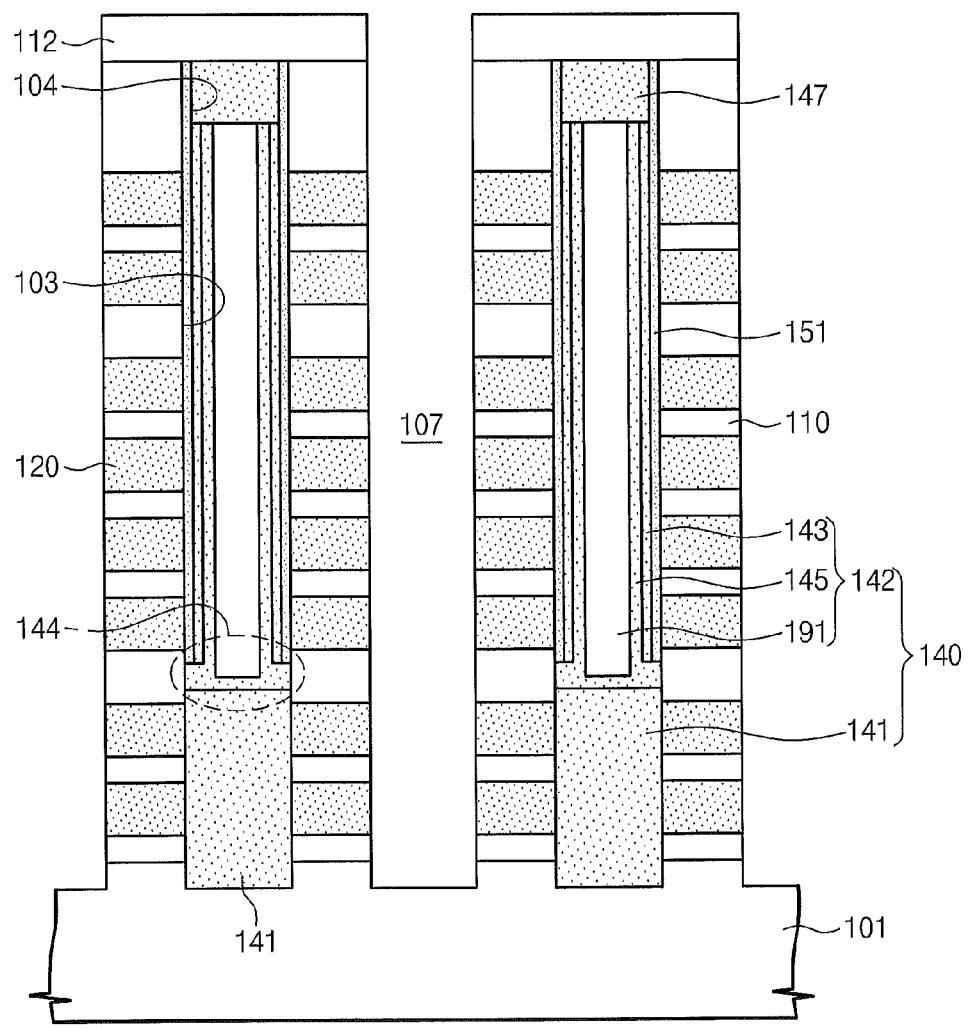
Figure 1N:
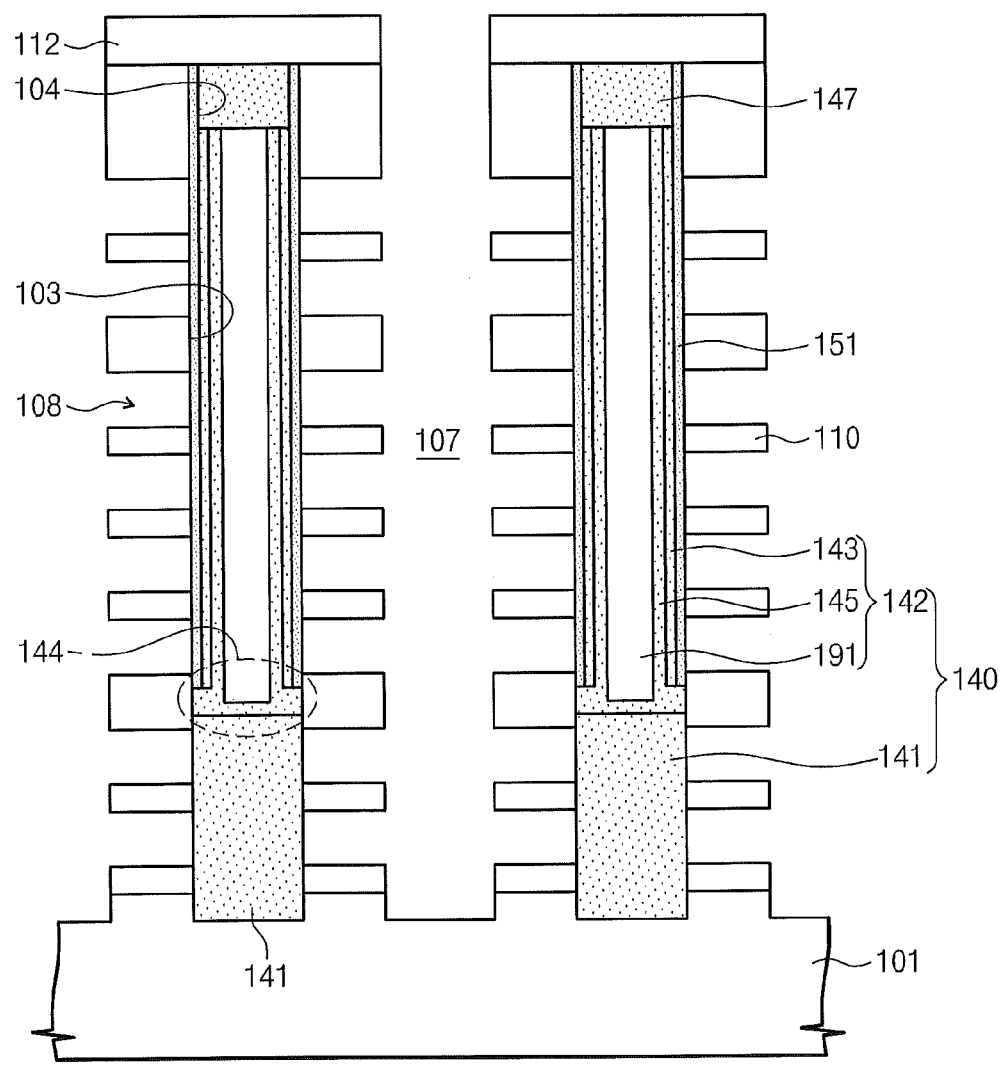
Figure 10:
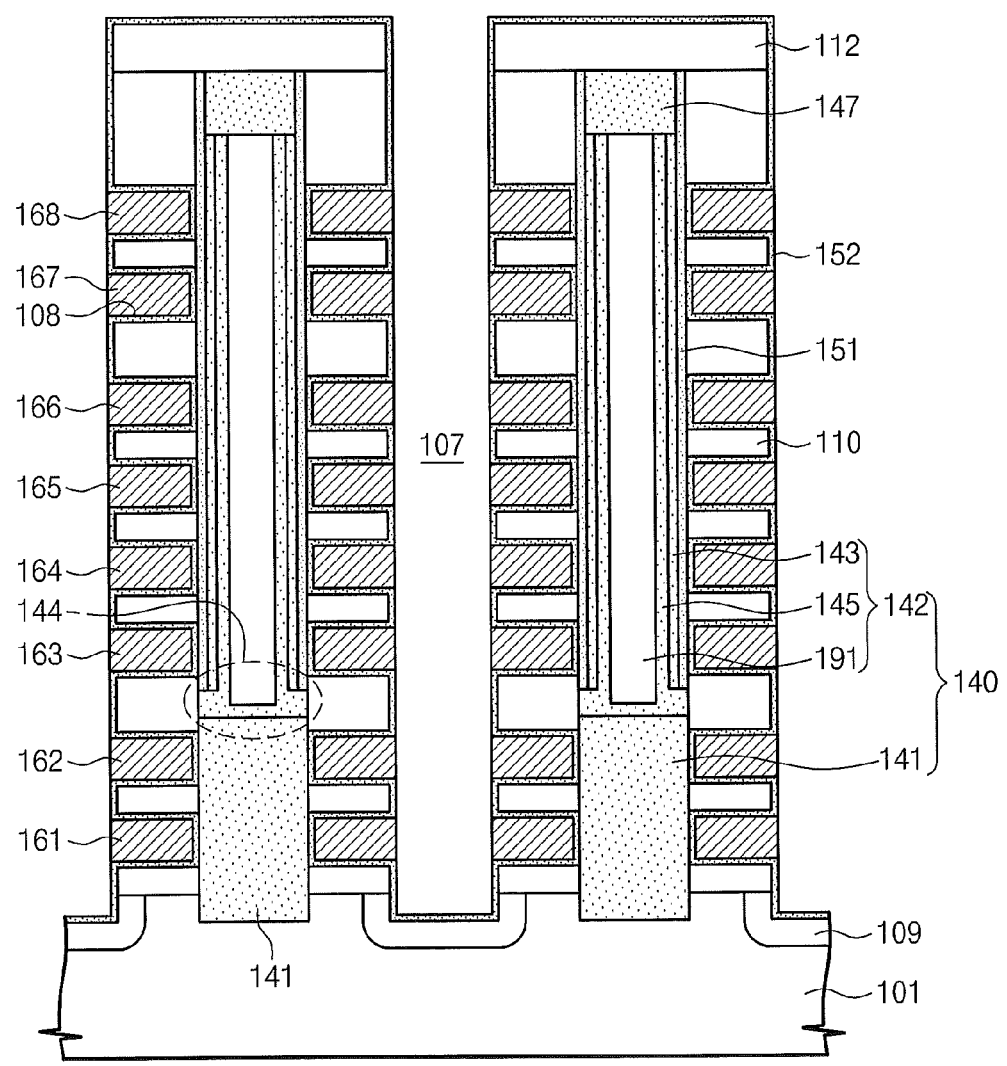
Figure 1P:
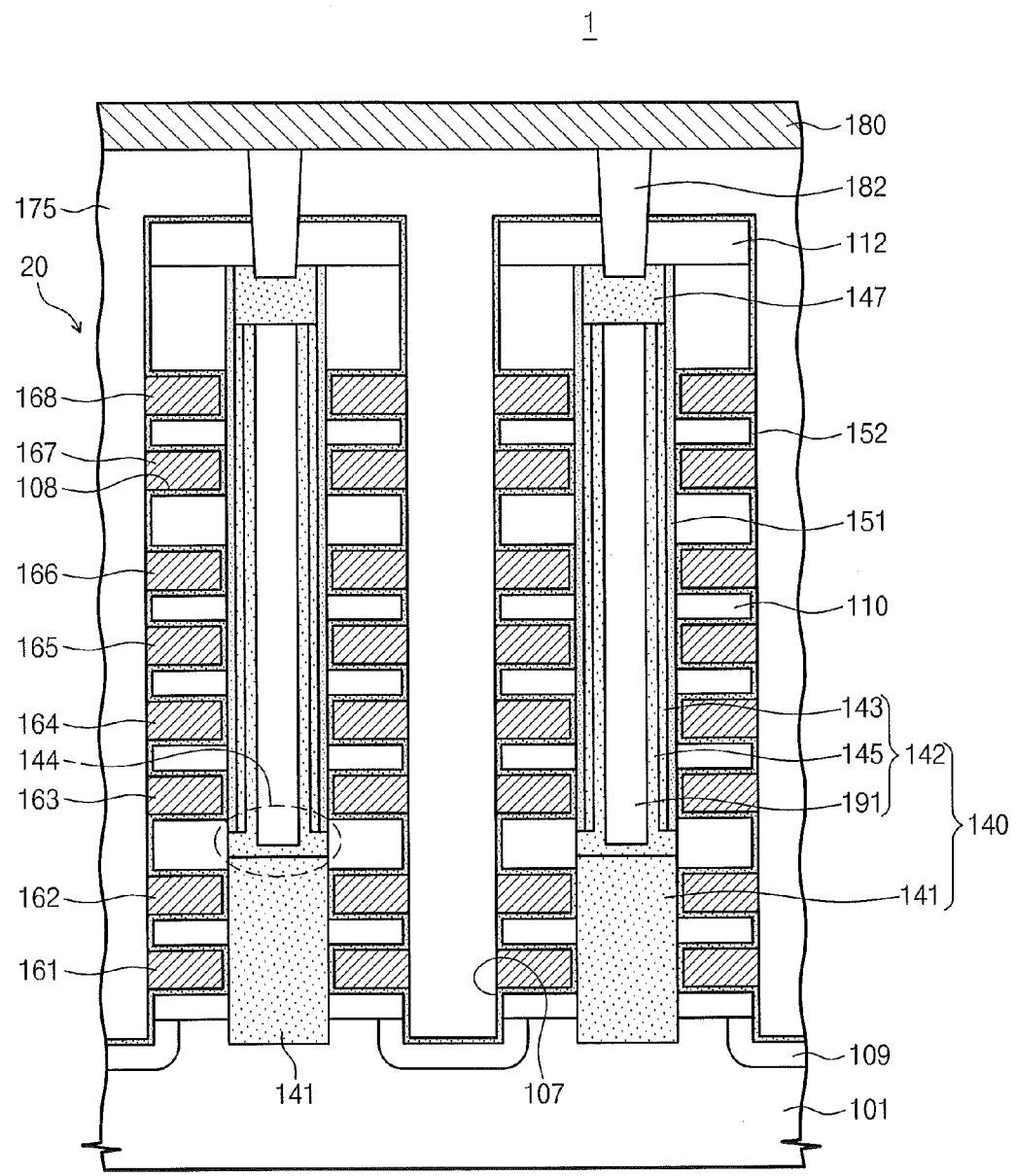

FIGS. 1A through 1P are sectional views illustrating methods of fabricating a semiconductor device according to example embodiments of the inventive concept.

Referring to FIG. 1A, a mold stack 10 may be formed on a substrate 101, and a mask layer 90 may be formed on the mold stack 10. The substrate 101 may include a semiconductor substrate such as a single crystalline silicon wafer). The mold stack 10 may include a plurality of mold layers, which may be formed by depositing a plurality of insulating layers 110 and a plurality of sacrificial layers 120 alternatingly and sequentially. The insulating layers 110 may be formed of a material having an etch selectivity with respect to the sacrificial layers 120. For example, the insulating layers 110 may be formed of a silicon oxide layer (e.g., SiOx), and the sacrificial layers 120 may be formed of a silicon nitride layer (e.g., SiNx). The sacrificial layers 120 may have substantially the same thicknesses. Thicknesses of the insulating layers 110 may be substantially equivalent to or different from each other. In some embodiments, third, seventh, ninth insulating layers 110c, 110g, and 110i of the insulating layers 110 may be relatively thicker than the others. In the drawings, the reference numerals 110a to 110i represent first to ninth insulating layers including the insulating layers 110, and the reference numerals 120a to 120h represent first to eighth sacrificial layers including the sacrificial layers 120. The mask layer 90 may include at least one layer. For example, the mask layer 90 may include a first mask layer 91, a second mask layer 93, and a third mask layer 95, which are sequentially stacked on the mold stack 10. In some embodiments, the first mask layer 91 may include a silicon layer. The second mask layer 93 may be a layer including at least one of oxide, nitride and any combination thereof. The third mask layer 95 may be a layer including at least one of oxide, nitride, carbide, polymer and any combination thereof. For example, the first mask layer 91 may comprise a polysilicon layer, the second mask layer 93 may comprise a silicon oxide layer such as SiOx, and the third mask layer 95 may comprise an amorphous carbon layer (ACL). The third mask layer 95 may further include an anti-reflecting layer (ARL).

Referring to FIG. 1B, the third mask layer 95 may be etched using an photolithography process, and the second mask layer 93 and the first mask layer 91 may be etched, by a single etching step or by at least two etching steps, using the etched third mask layer 95 as an etch mask. As the result of the etching process, the mask layer 90 may be patterned to form an opening 92 exposing a portion of the ninth insulating layer 110i of the mold stack 10. In some embodiments, a width Wa of the opening 92 may taper off toward the mold stack 10 so that the width is greater at the opening than at the bottom. In other embodiments, the width Wa of the opening 92 may be uniform regardless of a vertical level.

Referring to FIG. 1C, the mold stack 10 may be patterned to form a vertical channel hole 103. For example, the formation of the vertical channel hole 103 may include a dry etching step using the mask layer 90 as an etch mask, and thus, the vertical channel hole 103 may be formed to vertically penetrate the mold stack 10 and expose the substrate 101. In some embodiments, the substrate 101 in the vertical channel hole 103 may be recessed, due to an over etch in the dry etching step. A width Wb of the vertical channel hole 103 may be uniform regardless of the vertical level or may vary depending on the vertical level. For example, the vertical channel hole 103 may be formed to have a profile tapering off toward the mask layer 90. In other embodiments, the width Wb of the vertical channel hole 103 may be substantially uniform regardless of on a vertical level. The third mask layer 95 may be removed after the formation of the vertical channel hole 103.

Referring to FIG. 1D, a mask trimming process may be performed to shrink the mask layer 90. The mask trimming process may include a step of non-isotropically reducing a size of the first mask layer 91. The mask trimming process may comprise a dry etching process. In some embodiments, the mask trimming process may include a plasma etching step, in which the first mask layer 91 may be etched using an etching gas containing at least one of $Cl_2$ and $SF_6$ in a low pressure condition less than atmospheric pressure). In some embodiments, the amount of the gas supplied and/or a plasma power may be controlled to suppress an etching of the substrate 101, which may occur in the trimming of the first mask layer 91. Due to the presence of the second mask layer 93, the etching gas may be prevented from being in direct contact with a top surface of the first mask layer 91, and thus, it may be possible to suppress the side wall of the first mask layer 91 from being isotropically etched. Accordingly, the first mask layer 91 may shrink (i.e., be recessed away from the opening) in a lateral direction and maintain a uniform vertical thickness during the trimming process so that the width Wa is increased at the first mask layer level. The second mask layer 93 may be removed or may remain after the mask trimming process.

Referring to FIG. 1E, an upper spacer layer 96 may be formed to wrap the first mask layer 91. The upper spacer layer 96 may be formed of a dielectric layer (e.g., of silicon oxide, silicon nitride, silicon carbide, or resin), which may be formed using a chemical vapor deposition (CVD) technique. In some embodiments, the upper spacer layer 96 may not fill the vertical channel hole 103, for example, the upper spacer layer 96 may be formed to wrap the first mask layer 91. In some embodiments according to the inventive concept, the upper spacer layer covers an entire side wall of the first mask layer 91. The upper spacer layer 96 may extend into the vertical channel hole 103 and, for example, cover an upper sidewall of the ninth insulating layer 110i. As a comparison, if the first mask layer 91 is not etched by the trimming process, a width Wc of an upper entrance 103f of the vertical channel hole 103 may become too narrow due to sidewalls 96f of the upper spacer layer 96 cover (or too greatly obscure) the upper entrance 103f. By contrast, according to example embodiments of the inventive concept, by virtue of the process of trimming the first mask layer 91, a distance between the sidewalls 96w (i.e., the width Wc of the upper entrance 103e) can be increased, compared with the above comparison. If the width Wc increases, a subsequent process, such as, supplying a deposition or etching gas into the vertical channel hole 103 may be made more effective. The width Wc of the upper entrance 103e may be uniform or vary according to profiles of the first mask layer 91 and/or the upper spacer layer 96. Exemplary embodiments of the inventive concept may not be limited thereto, and for example, the width Wc may be increasing and then decreasing. In some embodiments, a mean width of the upper entrance 103e may be wider than that of the vertical channel hole 103, although the upper entrance 103e may have a portion whose width is smaller than the width Wb of the vertical channel hole 103. In other embodiments, the width Wc of the upper entrance 103e may be greater than the width Wb of the vertical channel hole 103 regardless of the vertical level.

Referring to FIG. 1F, a lower channel 141 may be locally formed in a lower portion of the vertical channel hole 103. The lower channel 141 may be formed to be in contact with the substrate 101 and have a pillar shape. The lower channel 141 may be formed of a semiconductor layer, whose conductivity type is the same as that of the substrate 101 or intrinsic. For example, the lower channel 141 may include a p-type silicon layer or an intrinsic silicon layer. The lower channel 141 may be a polysilicon layer, which may be formed by a vapor deposition technique, or a single crystalline semiconductor layer, which may be formed by using one of epitaxial growth techniques and laser crystallization techniques. In some embodiments, the lower channel 141 may be formed by growing a p-type or intrinsic single-crystalline silicon layer using a selective epitaxial growth (SEG) technique. The lower channel 141 may be formed to be in contact with sidewalls of the first and second sacrificial layers 120a and 120b and moreover to be in partial contact with a sidewall of third insulating layer 110c. In some embodiments, due to the presence of the upper spacer layer 96, it may be possible to prevent an epitaxial layer from being grown from the first mask layer 91.

Referring to FIG. 1G, a first information storing layer 151 may be formed to cover an inner wall of the vertical channel hole 103 and the upper spacer layer 96, a first semiconductor layer 143 may be formed to cover the first information storing layer 151, and a liner spacer layer 190 may be formed to cover the first semiconductor layer 143. The first information storing layer 151 may be formed using a chemical vapor deposition or atomic layer deposition process to have a relatively small thickness. In some embodiments, the first information storing layer 151 may be a single- or multi-layered structure covering the lower channel 141.

For example, as shown in FIG. 1H, the first information storing layer 151 may include a tunnel insulating layer 151c. In other embodiments, the first information storing layer 151 may include the tunnel insulating layer 151c and a trap insulating layer 151b. In still other embodiments, the first information storing layer 151 may include the tunnel insulating layer 151c, the trap insulating layer 151b, and a blocking layer 151a. For example, the formation of the first information storing layer 151 may include depositing the blocking layer 151a (e.g., of silicon oxide, aluminum oxide or hafnium oxide) on the inner wall of the vertical channel hole 103, depositing the trap insulating layer 151b (e.g., of silicon nitride) on the blocking layer 151a, and depositing the tunnel insulating layer 151c (e.g., of silicon oxide) on the trap insulating layer 151b. The blocking layer 151a may be a dual-layered structure including a silicon oxide layer and an aluminum oxide layer.

Referring back to FIG. 1G, the first semiconductor layer 143 may be a semiconductor layer (e.g., of polysilicon or single-crystalline silicon) deposited by CVD or ALD. The liner spacer layer 190 may be formed by depositing a dielectric layer (e.g., of SiOx, SiNx, SiOx/SiNx) covering the first semiconductor layer 143 in a thin thickness. In some embodiments, since the vertical channel hole 103 has the enlarged upper entrance 103f, the deposition gas can be effectively supplied into the vertical channel hole 103.

Referring to FIG. 1I, the liner spacer layer 190 and the first semiconductor layer 143 may be etched in an etch-back manner. As a result, the liner spacer layer 190 may be patterned to have a pipe shape covering an inner wall of the first semiconductor layer 143 and exposing the first semiconductor layer 143 at the bottom of the vertical channel hole 103. The first semiconductor layer 143 may be patterned to expose a portion of the first information storing layer 151 at the bottom of the vertical channel hole 103 (where it is not covered with the pipe-shaped liner spacer layer 190). Due to the enlarged upper entrance 103e, the etching gas can be effectively supplied into the vertical channel hole 103, during the patterning of the liner spacer layer 190 and the first semiconductor layer 143.

Referring to FIG. 1J, the first information storing layer 151 may be etched to have a pipe shape. For example, a wet etching process may be performed to delimit the first information storing layer 151 within a localized region between the pipe-shaped liner spacer layer 190 and the inner wall of the vertical channel hole 103. In some embodiments, the liner spacer layer 190 may be removed, and as the result of the etching of the first information storing layer 151, an opening portion 105 may be formed to expose the entire top surface of the lower channel 141.

Referring to FIG. 1K, a second semiconductor layer 145 and an insulating gap-filling layer 191 may be sequentially formed. The second semiconductor layer 145 may fill partially or wholly the opening portion 105 and cover conformally an inner wall of the upper spacer layer 96. For example, the second semiconductor layer 145 may have a cylindrical structure. The insulating gap-filling layer 191 may be formed to fill an inner space of the cylindrical second semiconductor layer 145. The second semiconductor layer 145 may be, for example, formed of the same material (e.g., polysilicon or single crystalline silicon) as the first semiconductor layer 143 and be formed using a CVD or ALD process. The gap-filling layer 191 may be a silicon oxide layer or a silicon nitride layer, which may be formed using a deposition process. In some embodiments, before the formation of the gap-filling layer 191, a hydrogen annealing process may be further performed to cure crystal defects in the first and second semiconductor layers 143 and 145. In some embodiments, the second semiconductor layer 145 and the gap-filling layer 191 may be formed after removing the first semiconductor layer 143.

Referring to FIG. 1L, a planarization process may be performed to expose the mold stack 10. For example, a chemical mechanical polishing (CMP) or etch-back process may be performed to remove the upper spacer layer 96 and the first mask layer 91 and expose the ninth insulating layer 110i. In some embodiments, the ninth insulating layer 110i may be partially recessed. As the result of the planarization process, the second semiconductor layer 145 may be confined within the vertical channel hole 103 to have a cylindrical structure, and the gap-filling layer 191 may be patterned to have a pillar structure filling an inner space of the cylindrical second semiconductor layer 145. In some embodiments, the first semiconductor layer 143, the second semiconductor layer 145, and the gap-filling layer 191 may provide an upper channel 142. In the upper channel 142, the second semiconductor layer 145 may be formed to have a hollow pipe structure or a macaroni structure. The upper channel 142 may be in contact with the lower channel 141 and thus form a vertical channel 140. A bottom portion 144 of the second semiconductor layer 145 connected to the lower channel 141 may be shaped like a pillar or bulk structure. Due to the presence of the bottom portion 144 of the second semiconductor layer 145, the upper channel 142 can be electrically connected to the lower channel 141 with good contact characteristics. For example, it may be possible to increase a contact area between the lower channel 141 and the upper channel 142, and this may help prevent the vertical channel 140 from being electrically opened or cut.

Referring to FIG. 1M, a trench 107 may be formed between the vertical channels 140. For example, the formation of the trench 107 may include forming a capping insulating layer 112 (e.g., of silicon oxide or silicon nitride) on the mold stack 10, and pattering the mold stack 10 using the capping insulating layer 112 as an etch mask in a dry etching manner. The trench 107 may be formed to expose the substrate 101. In some embodiments, the substrate 101 may be recessed by an over etching during the formation of the trench 107. The trench 107 may be formed to expose sidewalls of the sacrificial layers 120 and the insulating layers 110. In some embodiments, before the formation of the capping insulating layer 112, a third semiconductor layer 147 may be formed to be in contact with the vertical channel 140. The formation of the third semiconductor layer 147 may include partially removing an upper portion of the vertical channel 140 to form a hole 104, and then filling the hole 104 with a semiconductor material. The third semiconductor layer 147 may be doped with impurities having a different conductivity type from the substrate 101, thereby serving as a drain electrode. Alternatively, the conductivity type of the third semiconductor layer 147 may be controlled by injecting the impurities having a different conductivity type from the substrate 101 into the semiconductor material provided in the hole 104.

Referring to FIG. 1N, the sacrificial layers 120 may be selectively removed by supplying an etchant to the trench 107. For example, in the case in which the sacrificial layers 120 is a silicon nitride layer and the insulating layers 110 is a silicon oxide layer, the etchant may contain phosphoric acid ($H_3PO_4$). As the selective removal of the sacrificial layers 120, spaces 108 may be formed between the insulating layers 110 to expose the lower channel 141 and the first information storing layer 151.

Referring to FIG. 1O, a second information storing layer 152 may be formed to conformally cover outer surfaces of the insulating layers 110, and then gates 161-168 may be formed to fill the spaces 108 provided with the second information storing layer 152. The gates 161-168 may be vertically spaced apart from each other by the insulating layers 110 to form a gate stack 20. The second information storing layer 152 may be a single layered structure or a multilayered structure. For example, the first information storing layer 151 may include a trap insulating layer and a tunnel insulating layer, and the second information storing layer 152 may include a blocking layer. Alternatively, the first information storing layer 151 may include the tunnel insulating layer, and the second information storing layer 152 may include the blocking layer and the trap insulating layer. In other embodiments, the first information storing layer 151 may include the tunnel insulating layer, the trap insulating layer, and a first blocking layer, and the second information storing layer 152 may include the first blocking layer or a second blocking layer. The gates 161-168 may be formed by depositing a conductive layer (e.g., of silicon, metal, metal nitride, or metal silicide) and patterning the conductive layer. A common source 109 may be formed by injecting a portion of the substrate 101 exposed by the trench 107 with impurities. The common source 109 may be formed to have a different conductivity type from the substrate 101. For example, the substrate 101 may be p-type, and the common source 109 may be n-type.

The first and second gates 161 and 162 may be adjacent to the lower channel 141, and the third to eighth gates 163-168 may be adjacent to the upper channel 142. The first and second gates 161 and 162 may be portions of lower or ground selection lines and serve as gate electrodes of non-memory devices (e.g., a ground selection transistor). The third to sixth gates 163-166 may serve as word lines controlling memory cell transistors. The seventh and eighth gates 167 and 168 may be portions of upper or string selection lines and serve as gate electrodes of non-memory devices (e.g., a string selection transistor). In other embodiments, the third to seventh gates 163-167 may serve as the word lines, and the eighth gate 168 may serve as the upper selection line.

Referring to FIG. 1P, the trench 107 may be filled with an insulating gap-fill layer 175 covering the gate stack 20, and plugs 182 may be formed through the insulating gap-fill layer 175 and be connected to the third semiconductor layer 147. Next, bit lines 180 may be formed on the insulating gap-fill layer 175 and be electrically connected to the plug 182. In some embodiments, the semiconductor device 1 may be used as a vertical NAND FLASH memory device. The gates 161-168 may extend along a first horizontal direction on the substrate 101, and the bit line 180 may extend along a second horizontal direction, which may be substantially orthogonal to the first direction, on the substrate 101. A cell string may include the gates 161-168 that are vertically stacked around one vertical channel 140.

Second Embodiment

Figure 2A:
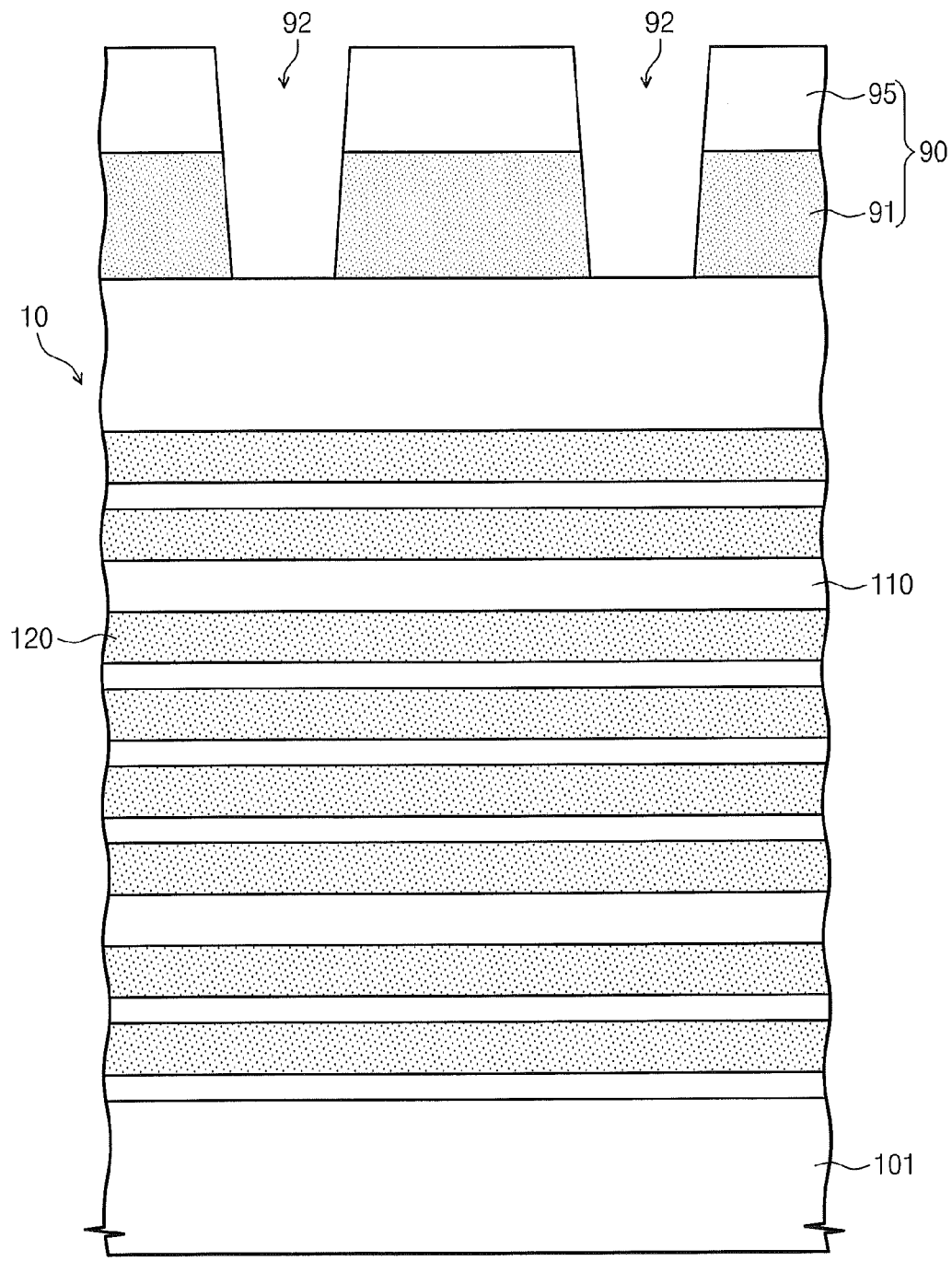
FIGS. 2A through 2C are sectional views illustrating methods of fabricating a semiconductor device according to other embodiments of the inventive concept.
Figure 2B:
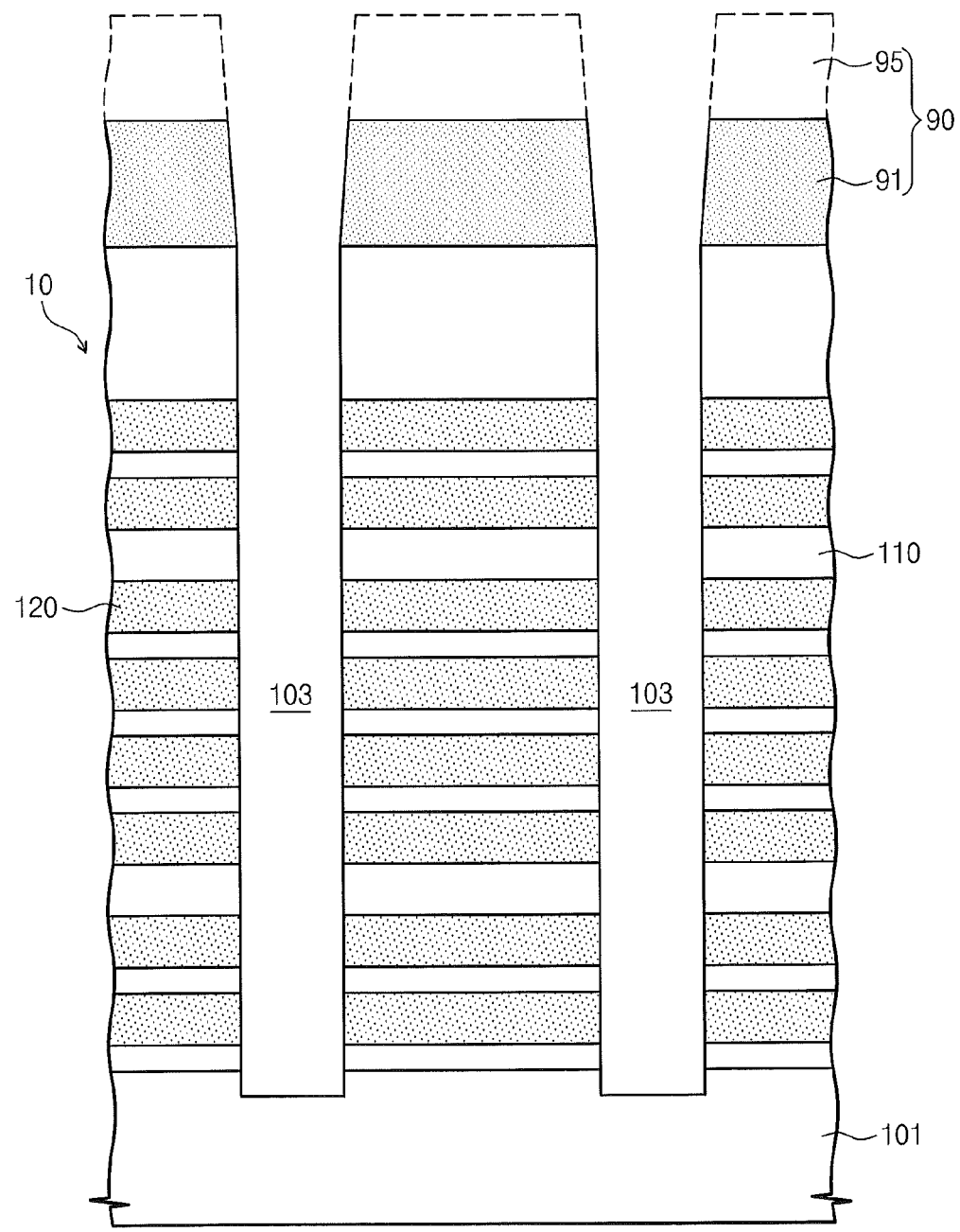
Figure 2C:
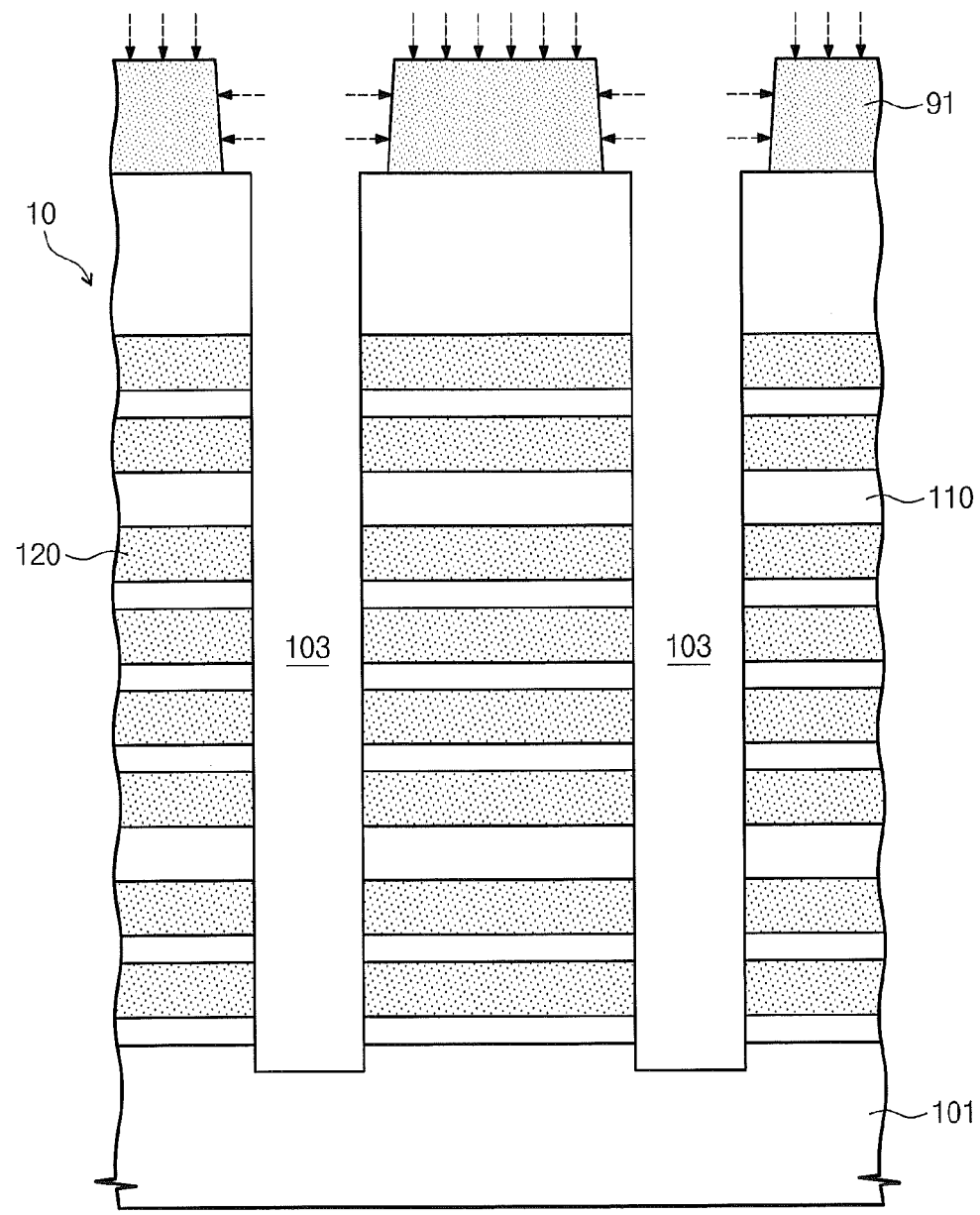

FIGS. 2A through 2C are sectional views illustrating a method of fabricating a semiconductor device according to other embodiments of the inventive concept.

Referring to FIG. 2A, the insulating layers 110 and the sacrificial layers 120 may be alternatingly stacked on the substrate 101 to form the mold stack 10. The mask layer 90 may be formed on the mold stack 10 to expose a portion of the mold stack 10. In some embodiments, the mask layer 90 may include the first mask layer 91 including a polysilicon layer and the third mask layer 95 including an amorphous carbon layer.

Referring to FIG. 2B, the mold stack 10 may be patterned to form the vertical channel hole 103 exposing the substrate 101. The formation of the vertical channel hole 103 may be performed, in a dry etching manner, using the mask layer 90 as an etch mask and be formed to penetrate the mold stack 10. In some embodiments, the third mask layer 95 of the mask layer 90 may be selectively removed.

Referring to FIG. 2C, a trimming process may be performed to reduce a size of the first mask layer 91. For example, a plasma etching process using an etchant containing at least one of $Cl_2$ and $SF_6$ may be performed to etch the first mask layer 91. In some embodiments, side and top surfaces of the first mask layer 91 may be exposed, and therefore, the first mask layer 91 may be etched in both lateral and vertical directions. The processes previously described with reference to FIGS. 1E through 1P may be performed to fabricate the remaining portions of the semiconductor device.

Third Embodiment

Figure 3A:
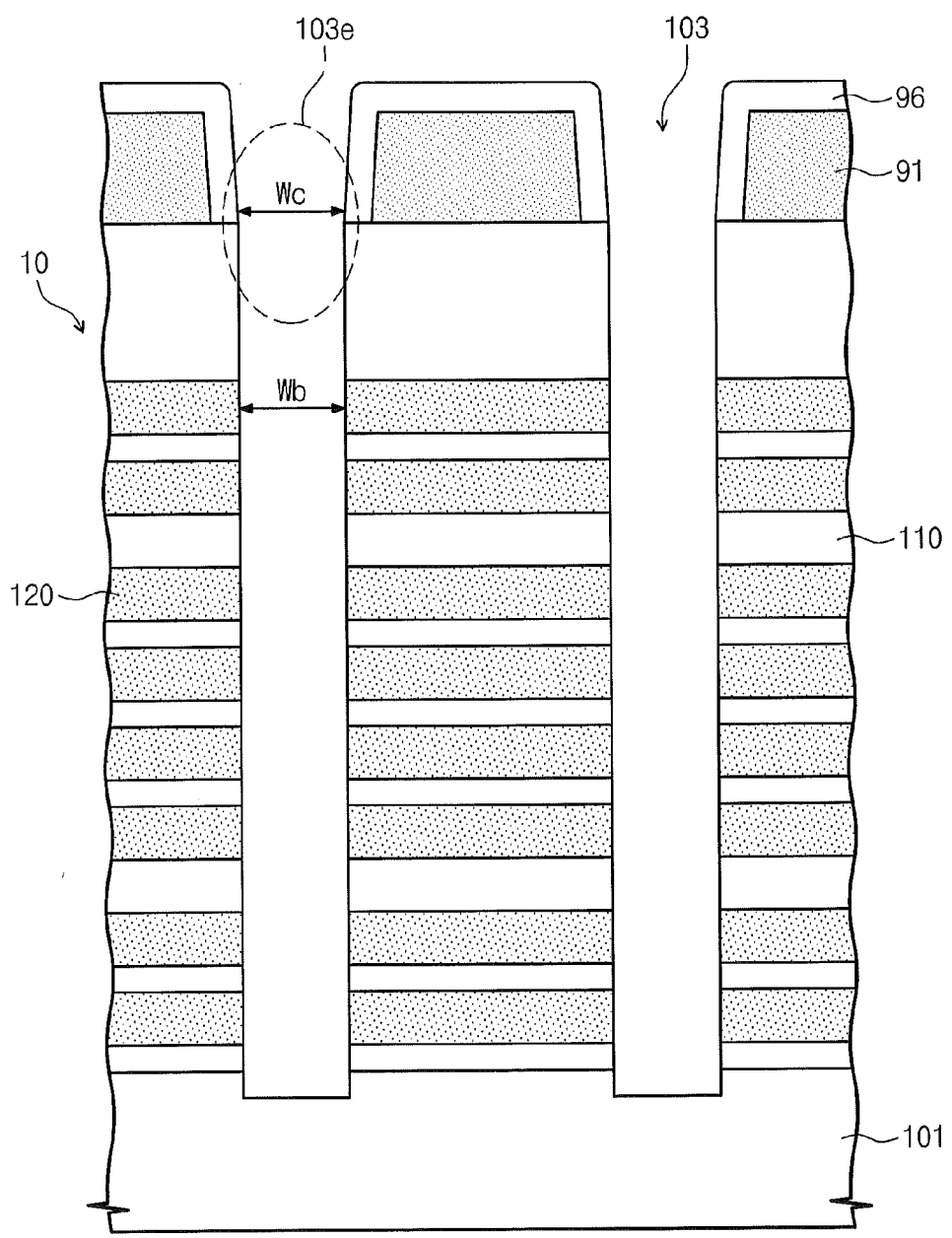
FIGS. 3A and 3B are sectional views illustrating methods of fabricating a semiconductor device according to still other embodiments of the inventive concept.
Figure 3B:
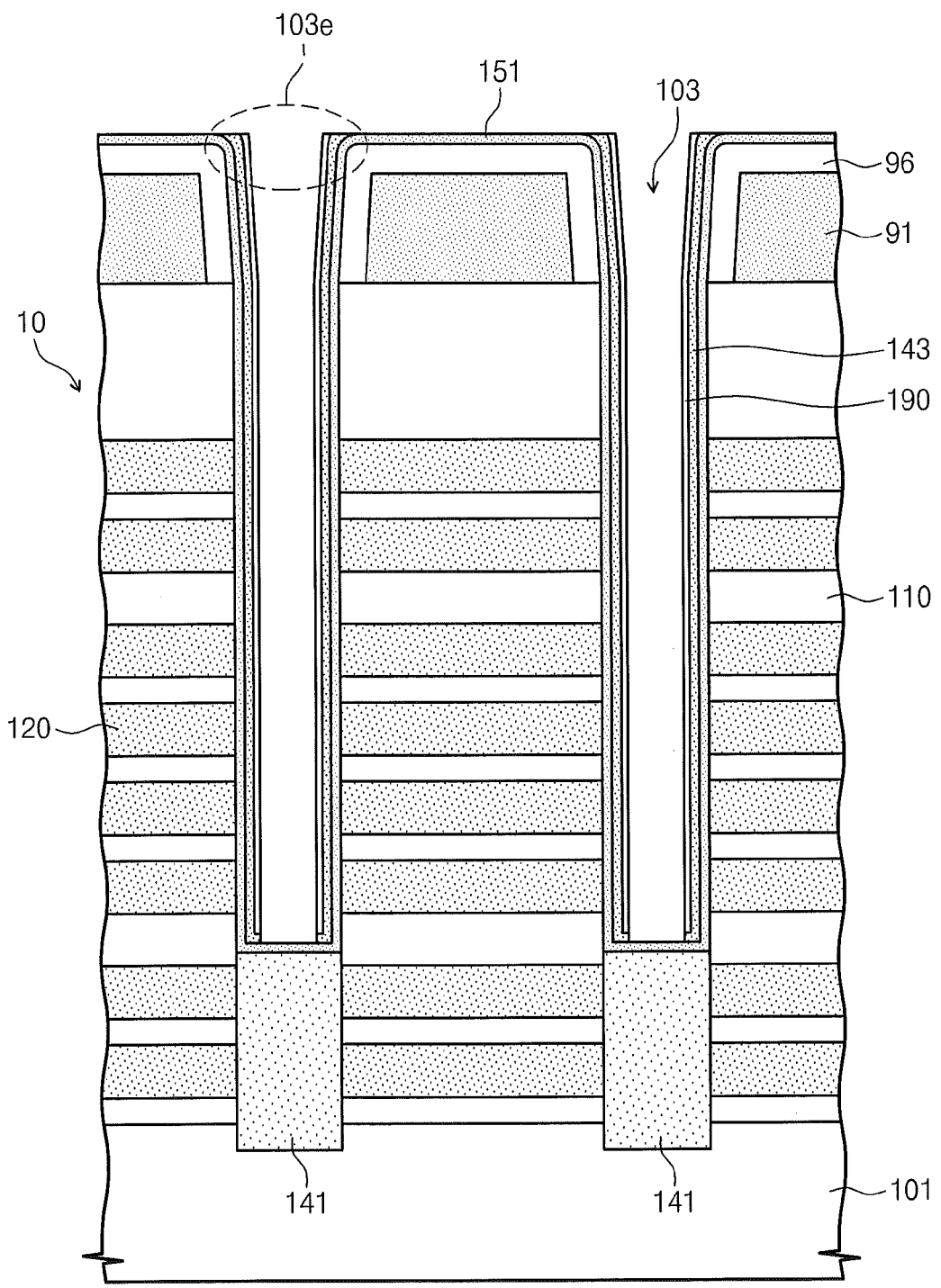

FIGS. 3A and 3B are sectional views illustrating methods of fabricating a semiconductor device according to still other embodiments of the inventive concept.

Referring to FIG. 3A, the insulating layers 110 and the sacrificial layers 120 may be alternatingly stacked on the substrate 101 to form the mold stack 10, and the mold stack 10 may be patterned to form the vertical channel hole 103 through the mold stack 10. The formation of the vertical channel hole 103 may be performed, in a dry etching manner, using the mask layer 91 as an etch mask. A trimming process may be performed to reduce a size of the first mask layer 91, and the upper spacer layer 96 may be formed to cover the first mask layer 91. The first mask layer 91 may be etched in a lateral direction, similar to the embodiment described with reference to FIG. 1D. In other embodiments, the first mask layer 91 may be etched in both lateral and vertical directions, similar to the embodiment described with reference to FIG. 2C. In some embodiments, the upper spacer layer 96 may be formed to cover the first mask layer 91 but not extend into the vertical channel hole 103. As a result, the upper entrance 103e may have a funnel shape, and the width Wc of the upper entrance 103e may be equivalent to or greater than the width Wb of the vertical channel hole 103.

Referring to FIG. 3B, the first information storing layer 151, the first semiconductor layer 143, and the liner spacer layer 190 may be formed after forming the lower channel 141. Thereafter, the liner spacer layer 190 and the first semiconductor layer 143 may be patterned using an etch-back process to expose a portion of the first information storing layer 151. In some embodiments, since the upper entrance 103e has an enlarged width, the deposition gas and/or an etching gas can be effectively supplied into the vertical channel hole 103, and this can facilitate subsequent deposition and/or etching processes. Next, the processes previously described with reference to FIGS. 1J through 1P may be performed to fabricate the remaining portions of the semiconductor device.

Applications of Embodiments

Figure 4A:
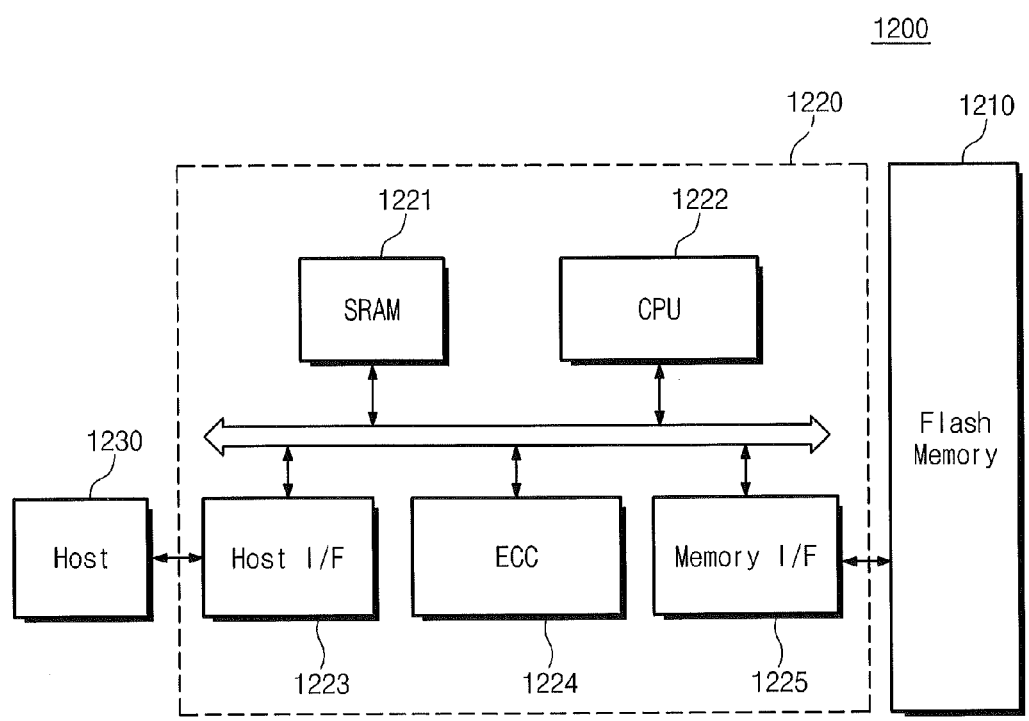
FIG. 4A is a block diagram of a memory card including a semiconductor device according to example embodiments of the inventive concept.

FIG. 4A is a block diagram of a memory card including a semiconductor device according to example embodiments of the inventive concept.

Referring to FIG. 4A, a memory card 1200 may include a memory controller 1220 controlling general data exchanges between a host and the memory device 1210. A static random access memory (SRAM) 1221 may be used as an operating memory of a centrl processing unit (CPU) 1222. A host interface 1223 may include a data exchange protocol of a host connected to the memory card 1200. An error correction block 1224 may detect and correct errors included in data read from the memory device 1210. A memory interface 1225 may interface with the memory device 1210. The CPU 1222 may perform general control operations for data exchange of the memory controller 1220. The memory card 1200 may be realized using the memory device 1210 including the semiconductor devices according to example embodiments of the inventive concept.

Figure 4B:
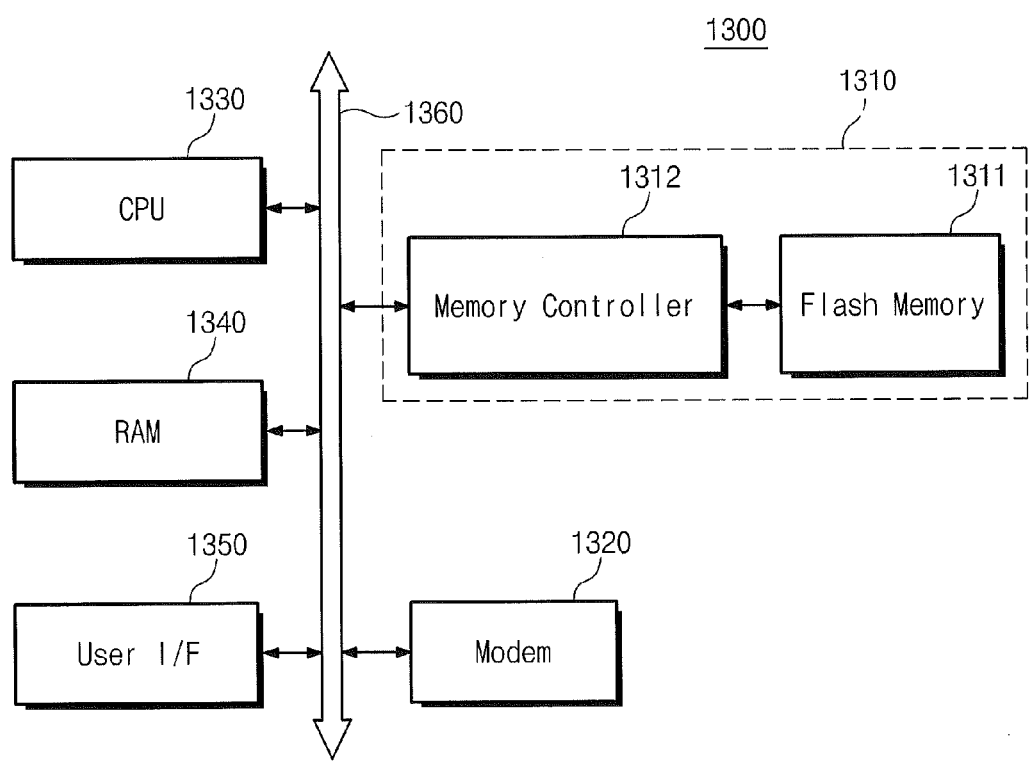
FIG. 4B is a block diagram of an information processing system including a semiconductor memory device according to example embodiments of the inventive concept.

FIG. 4B is a block diagram of an information processing system including a semiconductor memory device according to example embodiments of the inventive concept.

Referring to FIG. 4B, an information processing system 1300 may be realized using a memory system 1310 including the semiconductor memory device according to example embodiments of the inventive concept. For instance, the information processing system 1300 may be a mobile device and/or a desktop computer. In some embodiments, the information processing system 1300 may further include a modem 1320, a central processing unit (CPU) 1330, a random access memory (RAM) 1340, and a user interface 1350, which are electrically connected to a system bus 1360, in addition to the memory system 1310. The memory system 1310 may include a memory device 1311 and a memory controller 1312. In some embodiments, the memory system 1310 may be configured substantially identical to the memory card 1200 described with respect to FIG. 4A. Data processed by the CPU 1330 and/or input from the outside may be stored in the memory system 1310. In some embodiments, the memory system 1310 may be used as a portion of a solid state drive (SSD), and in this case, the information processing system 1300 may stably and reliably store a large amount of data in the memory system 1310. In some embodiments according to the inventive concept, an application chipset, a camera image sensor, a camera image signal processor (ISP), an input/output device, or the like may further be included in the information processing system 1300.

According to example embodiments of the inventive concept, the vertical channel hole is formed to have an enlarged upper entrance. By virtue of the enlarged upper entrance, a deposition gas and/or an etching gas can be effectively supplied into the vertical channel hole, and thus, it is possible to perform subsequent deposition and/or etching processes with a low degree of difficulty. This may enable improved structural reliability, fabrication reliability, and yield of the semiconductor device and reduced fabrication cost.

While example embodiments of the inventive concept have been particularly shown and described, it will be understood by one of ordinary skill in the art that variations in form and detail may be made therein without departing from the spirit and scope of the attached claims.

What is claimed is:

1. A method of fabricating a semiconductor device, the method comprising:
   forming a mold layer on a substrate;
   forming a mask layer on the mold layer;
   etching the mold layer using the mask layer as an etch mask to form a channel hole penetrating the mold layer;
   shrinking the mask layer to provide a reduced mask layer;
   forming a spacer layer to cover the reduced mask layer; and
   forming a vertical channel to fill the channel hole and be electrically connected to the substrate.

2. The method of claim 1, wherein the forming of the mask layer comprises:
   sequentially forming a lower mask layer including a silicon layer, an intermediate mask layer including an oxide or nitride layer, and an upper mask layer including a carbon layer, on the mold layer; and
   patterning the upper, intermediate, and lower mask layers to expose a portion of the mold layer.

3. The method of claim 2, wherein the shrinking of the mask layer comprises:
   removing the upper mask layer; and
   etching a side surface of the lower mask layer,
   wherein the intermediate mask layer covers a top surface of the lower mask layer such that the top surface of the lower mask layer is prevented from being etched.

4. The method of claim 3, further comprising removing the intermediate mask layer after the etching of the side surface of the lower mask layer.

5. The method of claim 1, wherein the forming of the mask layer comprises:
   sequentially forming a lower mask layer including a silicon layer and an upper mask layer including a carbon layer, on the mold layer; and
   patterning the upper and lower mask layers to expose a portion of the mold layer.

6. The method of claim 5, wherein the shrinking of the mask layer comprises:
   removing the upper mask layer; and
   etching side and top surfaces of the lower mask layer.

7. The method of claim 5, wherein the forming of the vertical channel comprises:
   filling a portion of the channel hole to form a lower channel connected to the substrate; and
   filling another portion of the channel hole to form an upper channel connected to the lower channel.

8. The method of claim 7, wherein the lower channel is formed by growing a single crystalline silicon layer from the substrate exposed by the channel hole, and the upper channel is formed by depositing a single crystalline silicon layer or a polysilicon layer.

9. The method of claim 8, further comprising forming a memory layer on an inner wall of the channel hole before the forming of the upper channel, wherein the memory layer extends along the inner wall of the channel hole.

10. A method of fabricating a semiconductor device, the method comprising:
    forming a mold stack including insulating layers and sacrificial layers alternatingly stacked on a substrate;
    forming a mask layer on the mold stack;
    etching the mold stack using the mask layer as an etch mask to form a channel hole exposing the substrate through the mold layer;
    shrinking the mask layer to provide a reduced mask layer;
    forming a spacer layer to wrap the reduced mask layer; and
    forming a vertical channel including a lower channel and an upper channel, the lower channel being grown from the substrate exposed by the channel hole and being electrically connected to the substrate, and the upper channel being stacked on the lower channel and being electrically connected to the lower channel; and
    replacing the sacrificial layers with gates.

11. The method of claim 10, wherein the mask layer comprises a silicon layer and an oxide layer sequentially stacked on the mold stack, and the shrinking of the mask layer comprises selectively etching a side surface of the silicon layer with plasma including at least one of $Cl_2$ and $SF_6$,
wherein the oxide layer is formed to prevent the plasma from being supplied onto a top surface of the silicon layer such that the top surface of the silicon layer is prevented from being etched.

12. The method of claim 10, wherein the mask layer comprises a silicon layer stacked on the mold stack, and the shrinking of the mask layer comprises selectively etching side and top surfaces of the silicon layer with plasma including at least one of $Cl_2$ and $SF_6$.

13. The method of claim 10, wherein the spacer layer extends into the channel hole to cover an upper side surface of the mold stack.

14. The method of claim 10, wherein the replacing of the sacrificial layers with the gates comprises:
  forming a trench between the vertical channels to expose the substrate through the mold stack;
  supplying an etchant through the trench to selectively remove the sacrificial layers; and
  forming the gates extending along a first horizontal direction on the substrate, the gates being formed by filling empty spaces, which are provided between the insulating layers by the removing of the sacrificial layers, with a conductive material.

15. The method of claim 14, further comprising forming a bit line electrically connected to the vertical channel, the bit line extending along a second horizontal direction crossing the first horizontal direction.

* * * * *